US012757682B2

(12) United States Patent
Miller et al.

(10) Patent No.: US 12,757,682 B2
(45) Date of Patent: Oct. 6, 2026

(54) REMOTE PLASMA DEPOSITION WITH ELECTROSTATIC CLAMPING

(71) Applicant: Lam Research Corporation, Fremont, CA (US)

(72) Inventors: Aaron Blake Miller, West Linn, OR (US); Aaron Durbin, Portland, OR (US); Jon Henri, West Linn, OR (US); Easwar Srinivasan, Portland, OR (US); Bradley Taylor Streng, Tigard, OR (US); Awnish Gupta, Hillsboro, OR (US); Bart J. Van Schravendijk, Palo Alto, CA (US); Fengyan Wei, Meridian, ID (US); Noah Elliot Baker, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 50 days.

(21) Appl. No.: 18/691,817

(22) PCT Filed: Sep. 15, 2022

(86) PCT No.: PCT/US2022/043630
§ 371 (c)(1),
(2) Date: Mar. 13, 2024

(87) PCT Pub. No.: WO2023/049012
PCT Pub. Date: Mar. 30, 2023

(65) Prior Publication Data

US 2024/0387226 A1 Nov. 21, 2024

Related U.S. Application Data

(60) Provisional application No. 63/261,533, filed on Sep. 23, 2021.

(51) Int. Cl.
*H10P 72/72* (2026.01)
*C23C 16/34* (2006.01)
(Continued)

(52) U.S. Cl.
CPC .......... *H10P 72/722* (2026.01); *C23C 16/345* (2013.01); *C23C 16/45536* (2013.01);
(Continued)

(58) Field of Classification Search
CPC ............. H01L 21/6833; H01L 21/0217; H01L 21/02274; H01L 21/0228; C23C 16/345;
(Continued)

(56) References Cited

U.S. PATENT DOCUMENTS

| | | | |
|---|---|---|---|
| 5,628,829 | A | 5/1997 | Foster et al. |
| 5,688,331 | A | 11/1997 | Aruga et al. |

(Continued)

FOREIGN PATENT DOCUMENTS

| | | | |
|---|---|---|---|
| CN | 109037017 | A | 12/2018 |
| EP | 0855735 | A2 | 7/1998 |

(Continued)

OTHER PUBLICATIONS

International Preliminary Report on Patentability and Written Opinion dated Apr. 4, 2024 in PCT Application No. PCT/US2022/043630.

(Continued)

*Primary Examiner* — Yuechuan Yu
(74) *Attorney, Agent, or Firm* — Weaver Austin Villeneuve & Sampson LLP

(57) ABSTRACT

A remote plasma processing apparatus with an electrostatic chuck can deposit film on a semiconductor substrate by atomic layer deposition or chemical vapor deposition. The remote plasma processing apparatus can include a remote plasma source and a reaction chamber downstream from the
(Continued)

remote plasma source. An RF power source can be configured to apply high RF power to the remote plasma source and heating elements can be configured to apply high temperatures to the electrostatic chuck. The semiconductor substrate can be dechucked from the electrostatic chuck using a declamping routine that alternates reversing polarities and reducing clamping voltages. In some embodiments, silicon nitride film can be conformally deposited by atomic layer deposition using a mixture of nitrogen, ammonia, and hydrogen gases as a source gas for remote plasma generation.

11 Claims, 13 Drawing Sheets

(51) Int. Cl.

| | |
|---|---|
| ***C23C 16/455*** | (2006.01) |
| ***C23C 16/458*** | (2006.01) |
| ***C23C 16/513*** | (2006.01) |
| ***H01J 37/32*** | (2006.01) |
| ***H10P 14/60*** | (2026.01) |
| ***H10P 14/694*** | (2026.01) |

(52) U.S. Cl.
CPC .... *C23C 16/45557* (2013.01); *C23C 16/4586* (2013.01); *C23C 16/513* (2013.01); *H01J 37/32357* (2013.01); *H01J 37/32449* (2013.01); *H01J 37/32724* (2013.01); *H01J 37/32816* (2013.01); *H10P 14/6336* (2026.01); *H10P 14/6339* (2026.01); *H10P 14/69433* (2026.01); *H01J 2237/3321* (2013.01); *H01J 2237/3323* (2013.01)

(58) Field of Classification Search
CPC ........ C23C 16/45536; C23C 16/45557; C23C 16/4586; C23C 16/513; H01J 37/32357; H01J 37/32449; H01J 37/32724; H01J 37/32816; H01J 2237/3321; H01J 2237/3323
See application file for complete search history.

(56) References Cited

U.S. PATENT DOCUMENTS

| | | | |
|---|---|---|---|
| 6,035,101 | A | 3/2000 | Sajoto et al. |
| 6,050,506 | A | 4/2000 | Guo et al. |
| 6,245,192 | B1 | 6/2001 | Dhindsa et al. |
| 6,461,435 | B1 | 10/2002 | Littau et al. |
| 8,764,902 | B2 | 7/2014 | Suzuki et al. |
| 10,008,368 | B2 | 6/2018 | Rozenzon et al. |
| 2004/0083977 | A1 | 5/2004 | Brown et al. |
| 2004/0099378 | A1 | 5/2004 | Kim et al. |
| 2005/0036268 | A1* | 2/2005 | Howald .............. H01L 21/6831 361/234 |
| 2009/0095222 | A1 | 4/2009 | Tam et al. |
| 2009/0159213 | A1 | 6/2009 | Bera et al. |
| 2009/0236447 | A1 | 9/2009 | Panagopoulos et al. |
| 2010/0254063 | A1* | 10/2010 | Sheng ................. H01L 21/6833 118/723 R |
| 2010/0272895 | A1 | 10/2010 | Tsuda |
| 2012/0083134 | A1* | 4/2012 | Wu ................... H01L 21/76864 118/696 |
| 2014/0103145 | A1 | 4/2014 | White et al. |
| 2014/0235069 | A1 | 8/2014 | Breiling et al. |
| 2015/0007770 | A1 | 1/2015 | Chandrasekharan et al. |
| 2015/0126045 | A1 | 5/2015 | Chatterjee et al. |
| 2015/0200042 | A1 | 7/2015 | Ling et al. |
| 2015/0318186 | A1 | 11/2015 | Zhang et al. |
| 2016/0032453 | A1 | 2/2016 | Qian et al. |
| 2017/0076921 | A1 | 3/2017 | Sakiyama et al. |
| 2018/0044791 | A1 | 2/2018 | Varadarajan et al. |
| 2018/0087155 | A1 | 3/2018 | Subramani et al. |
| 2018/0163305 | A1 | 6/2018 | Batzer et al. |
| 2018/0294144 | A1 | 10/2018 | Aubuchon et al. |
| 2019/0043726 | A1 | 2/2019 | Yang et al. |
| 2019/0048467 | A1 | 2/2019 | Sanchez et al. |
| 2019/0057858 | A1 | 2/2019 | Hausmann et al. |
| 2019/0177846 | A1 | 6/2019 | Batzer et al. |
| 2020/0013611 | A1* | 1/2020 | Niskanen .......... H01L 21/02274 |
| 2020/0090946 | A1* | 3/2020 | Citla ..................... C23C 16/505 |
| 2020/0402792 | A1* | 12/2020 | Ke .................... H01L 21/02181 |
| 2021/0202218 | A1* | 7/2021 | Parimi .................... C23C 16/26 |
| 2023/0332291 | A1 | 10/2023 | Varadarajan et al. |
| 2024/0234200 | A1 | 7/2024 | Miller et al. |

FOREIGN PATENT DOCUMENTS

| | | | |
|---|---|---|---|
| JP | H11343571 | A | 12/1999 |
| JP | 2001520463 | A | 10/2001 |
| JP | 2010021559 | A | 1/2010 |
| JP | 2014220231 | A | 11/2014 |
| JP | 2018050038 | A | 3/2018 |
| JP | 2020502793 | A | 1/2020 |
| JP | 2020517103 | A | 6/2020 |
| KR | 20140103080 | A | 8/2014 |
| KR | 20160116216 | A | 10/2016 |
| KR | 20160137404 | A | 11/2016 |
| KR | 20190050710 | A | 5/2019 |
| KR | 20190087608 | A | 7/2019 |
| KR | 20220071220 | A | 5/2022 |
| TW | 201037784 | A | 10/2010 |
| TW | 201218278 | A | 5/2012 |
| TW | 202018112 | A | 5/2020 |
| TW | 202025283 | A | 7/2020 |
| TW | 202133303 | A | 9/2021 |
| WO | WO-2021055918 | A1 | 3/2021 |
| WO | WO-2021061907 | A1 | 4/2021 |

OTHER PUBLICATIONS

International Preliminary Report on Patentability dated Apr. 6, 2023 in Application No. PCT/US2021/051179.
International Search Report and Written Opinion dated Feb. 9, 2023 in PCT Application No. PCT/US2022/043630.
International Search Report and Written Opinion dated Jan. 10, 2022 in PCT Application No. PCT/US2021/051179.
EP Extended European Search report dated Sep. 8, 2025 in EP Application No. 22873438.0.
EP Partial Supplementary European Search report dated Jun. 18, 2025, in EP Application No. 22873438.0.
International Preliminary Report on Patentability dated Dec. 7, 2023 in PCT Application No. PCT/US2022/072603.
International Search Report and Written Opinion report dated Sep. 14, 2022 in Application No. PCT/US2022/072603.
JP Office Action dated Apr. 30, 2025 in JP Application No. 2023518344, with English Translation.
KR Office Action dated Jun. 30, 2025 in KR Application No. 10-2022-7044800, with English Translation.
KR Office Action dated Sep. 16, 2025 in KR Application No. 10-2022-7046077, with English Translation.
TW Office Action and Search Report dated Aug. 29, 2025 in TW Application No. 110135748, with English Translation.
TW Office Action and Search Report dated Jul. 31, 2025 in TW Application No. 111119817, with English Translation.
U.S. Restriction Requirement dated Jul. 14, 2025 in U.S. Appl. No. 18/245,623.
KR Office Action dated Mar. 27, 2026 in KR Application No. 10-2022-7044800, with English Translation.
TW Office Action and Search Report dated Feb. 9, 2026 in TW Application No. 111135630, with English Translation.
U.S. Non-Final Office Action dated Nov. 24, 2025 in U.S. Appl. No. 18/245,623.
U.S. Final Office Action dated Jun. 4, 2026 in U.S. Appl. No. 18/245,623.

(56) References Cited

OTHER PUBLICATIONS

JP Office Action dated Apr. 21, 2026 in JP Application No. 2024-517030, with English Translation.

* cited by examiner

REMOTE PLASMA DEPOSITION WITH ELECTROSTATIC CLAMPING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes

FIELD

Implementations herein relate to semiconductor processing apparatuses and, more particularly to plasma processing apparatuses including a remote plasma source and electrostatic chuck for vapor deposition.

BACKGROUND

Semiconductor substrate processing apparatuses are used to process semiconductor substrates by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL), and resist removal. One type of semiconductor substrate processing apparatus is a plasma processing apparatus. Many semiconductor processes expose a wafer to plasma and expose the wafer to temperatures above ambient or room temperature. A substrate support structure such as a pedestal is generally used to heat the wafer to a desired temperature. In addition, the substrate support structure may include an electrostatic chuck for clamping the wafer to the electrostatic chuck by an electrostatic attractive force.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a remote plasma apparatus. The remote plasma apparatus includes a reaction chamber comprising a processing space in which a semiconductor substrate is processed, a remote plasma source fluidly coupled to and upstream of the reaction chamber, an RF power supply configured to power plasma in the remote plasma source, a showerhead fluidly coupled to the reaction chamber for delivery of plasma-activated species from the remote plasma source to the reaction chamber, and a substrate pedestal in the reaction chamber. The substrate pedestal includes an electrostatic chuck comprising a platen made of ceramic material and having an upper surface configured to support the semiconductor substrate, where the electrostatic chuck further comprises one or more electrostatic clamping electrodes.

In some implementations, the showerhead comprises an ion filter. In some implementations, the substrate pedestal further comprises one or more heating elements configured to heat the semiconductor substrate to a temperature between about 300° C. and about 750° C. In some implementations, the RF power supply is configured to supply RF power between about 2 kW and about 10 KW to the remote plasma source for generating plasma. In some implementations, the remote plasma apparatus further includes a first gas line fluidly coupled to the remote plasma source configured to supply a reactant gas to the remote plasma source, and a second gas line fluidly coupled to the reaction chamber configured to supply a silicon-containing precursor in a vapor phase to the semiconductor substrate without mixing with the reactant gas in the remote plasma source. In some implementations, the remote plasma apparatus further includes a controller configured with instructions to perform the following operations: introduce a first dose of the silicon-containing precursor in the vapor phase to adsorb on the semiconductor substrate, and expose the semiconductor substrate to plasma-activated species of the reactant gas generated in the remote plasma source, where the plasma-activated species reacts with the silicon-containing precursor to form a silicon-containing film. In some implementations, the controller is further configured with instructions to perform the following operations: set a chamber pressure in the reaction chamber to between about 1 Torr and about 30 Torr, and set a substrate temperature to an elevated temperature between about 500° C. and about 700° C. In some implementations, the controller is further configured with instructions to perform the following operations: apply a first voltage to the electrostatic chuck of the substrate pedestal for clamping the semiconductor substrate in the reaction chamber, reverse a polarity of the first voltage applied to the electrostatic chuck, apply a second voltage to the electrostatic chuck that is less than the first voltage, reverse a polarity of the second voltage applied to the electrostatic chuck, and remove the semiconductor substrate from the electrostatic chuck. In some implementations, the silicon-containing precursor comprises a silane. In some implementations, the ceramic material comprises an aluminum-containing material, and the one or more electrostatic clamping electrodes are embedded in the platen. In some implementations, the remote plasma apparatus further includes an annular-shaped thermal shield under the substrate pedestal to reduce radiative heat loss from the substrate pedestal.

Also provided herein is a method of depositing a dielectric film using remote plasma. The method includes applying a voltage to an electrostatic chuck of a substrate pedestal for clamping a semiconductor substrate in a reaction chamber, and depositing a dielectric film on the semiconductor substrate by a remote plasma atomic layer deposition (RP-ALD) or remote plasma chemical vapor deposition (RP-CVD) process.

In some implementations, depositing the dielectric film on the semiconductor substrate includes introducing a dose of a precursor in a vapor phase to adsorb on the semiconductor substrate, and introducing, after introducing the dose of the precursor, a plasma-activated species of a reactant in a vapor phase to semiconductor substrate, where the plasma-activated species of the reactant is generated in a remote plasma source upstream from the reaction chamber. In some implementations, the method further includes heating the semiconductor substrate using one or more heating elements in the substrate pedestal to an elevated temperature between about 500° C. and about 700° C. In some implementations, the method further includes establishing in the reaction chamber a chamber pressure between about 1 Torr and about 30 Torr.

Also provided herein is a method of dechucking a semiconductor substrate from an electrostatic chuck. The method includes applying a first voltage to an electrostatic chuck of a substrate pedestal for clamping a semiconductor substrate in a reaction chamber, reversing a polarity of the first voltage applied to the electrostatic chuck, applying a second voltage to the electrostatic chuck that is less than the first voltage, reversing a polarity of the second voltage applied to the electrostatic chuck, and removing the semiconductor substrate from the electrostatic chuck.

In some implementations, the method further includes reducing a voltage to the electrostatic chuck to zero prior to removing the semiconductor substrate. In some implementations, the method further includes applying a third voltage to the electrostatic chuck that is less than the second voltage after reversing the polarity of the second voltage. In some implementations, the reversed polarity of the first voltage is applied for at least two seconds, the reversed polarity of the second voltage is applied for at least two seconds, where the second voltage is one-third of the first voltage and the third voltage is one-third of the second voltage. In some implementations, the method further includes exposing the semiconductor substrate to a transfer pressure in the reaction chamber prior to reversing the polarity of the first voltage.

Also provided herein is a method of depositing a silicon nitride film. The method includes flowing a first dose of a silicon-containing precursor in a vapor phase to adsorb on a semiconductor substrate in a reaction chamber, generating, from a source gas, at least nitrogen-containing radicals in a remote plasma source, where the first dose of the silicon-containing precursor is flowed into the reaction chamber via one or more gas ports downstream from the remote plasma source, and exposing the semiconductor substrate to at least the nitrogen-containing radicals to react the nitrogen-containing radicals and the silicon-containing precursor to form a silicon nitride film on the semiconductor substrate.

In some implementations, the source gas comprises nitrogen gas ($N_2$) and one or both of ammonia ($NH_3$) and hydrogen gas ($H_2$), wherein the nitrogen-containing radicals comprise at least one of nitrogen radicals (N*) and amine radicals (NH* or $NH_2$*) In some implementations, a flow rate of the nitrogen gas is between about 5000 sccm and about 40000 sccm, a flow rate of ammonia is between about 0 sccm and about 5000 sccm, and a flow rate of hydrogen gas is between about 0 sccm and about 5000 sccm. In some implementations, generating at least nitrogen-containing radicals from the source gas includes generating at least one of nitrogen radicals and amine radicals in the remote plasma source. In some implementations, a concentration of amine radicals generated in the remote plasma source is substantially greater than a concentration of hydrogen radicals. In some implementations, a chamber pressure in the remote plasma source is between about 0.5 Torr and about 40 Torr and an RF power supplied to an RF power source coupled to the remote plasma source is between about 2 kW and about 10 kW. In some implementations, a temperature of a substrate pedestal is between about 300° C. and about 750° C. In some implementations, the semiconductor substrate includes one or more recessed features having an aspect ratio of at least about 100:1, where a step coverage of the silicon nitride film deposited in the one or more recessed features is at least about 90%. In some implementations, the silicon nitride film has at least substantially uniform film properties along the one or more recessed features, where a wet etch rate of the silicon nitride film is between about 1.4 Å/min and about 10.0 Å/min and wherein a film density is between about 2.6 g/cm$^3$ and about 3.0 g/cm$^3$. In some implementations, the silicon-containing precursor includes one or more halosilanes.

DETAILED DESCRIPTION

Figure 1:
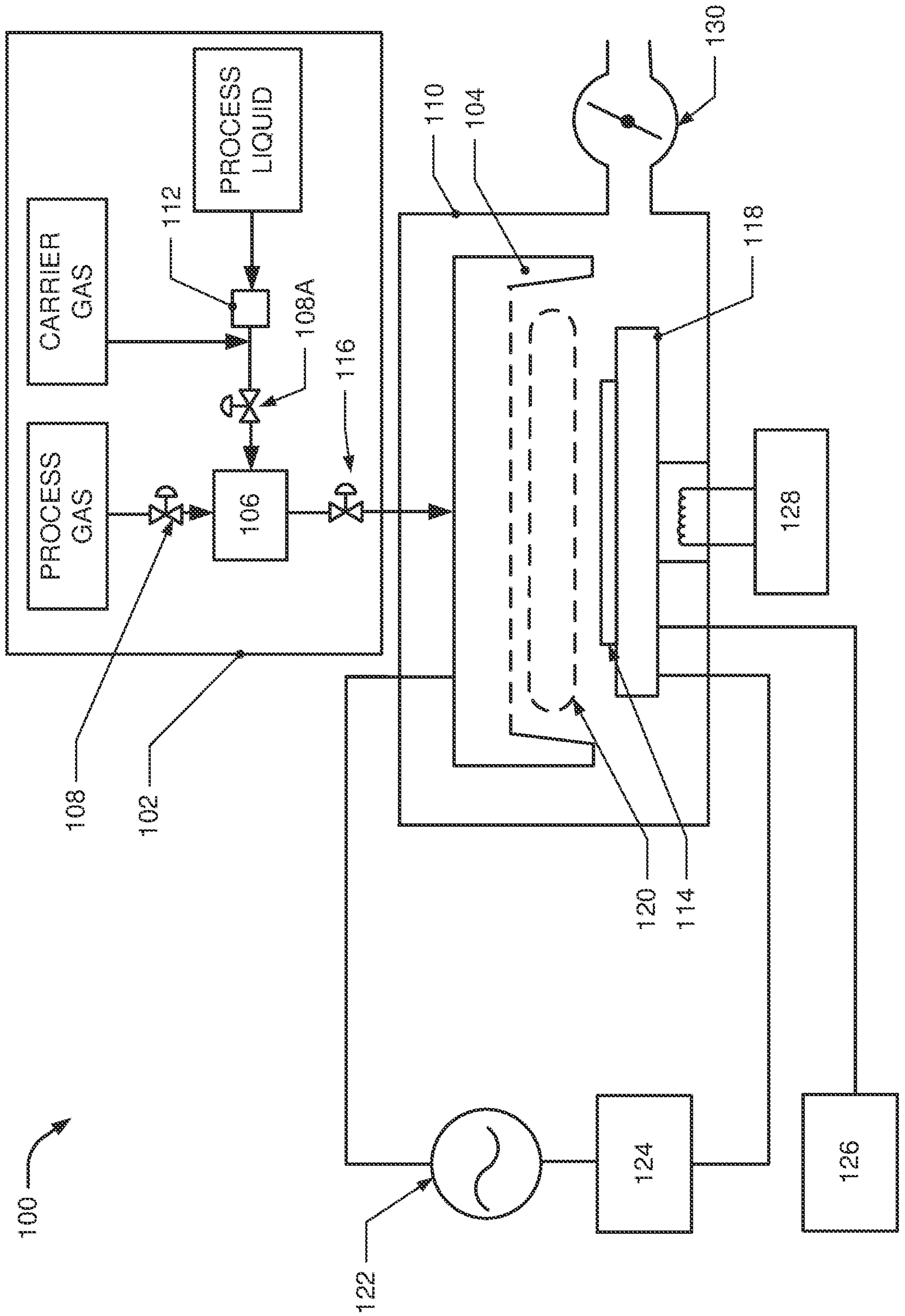
FIG. 1 shows a schematic illustration of an example semiconductor processing apparatus for performing deposition or etch according to some implementations.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

Semiconductor processing may involve deposition of one or more layers of film onto a substrate. Examples of deposition techniques may include but are not limited to PVD, CVD, PECVD, ALD, and PEALD. CVD processes may deposit a film on a substrate surface by flowing one or more gas reactants into a reaction chamber which form film precursors and byproducts. The precursors are transported to the substrate surface where they are adsorbed by the substrate and deposited on the substrate by gas phase chemical reactions. ALD is a deposition technique that involves multiple film deposition cycles. ALD deposits thin layers of material using sequential self-limiting reactions. Typically, an ALD cycle includes operations to deliver and adsorb at least one precursor to the substrate surface, and then react the adsorbed precursor with one or more reactants to form the partial layer of film. Purge steps are ordinarily carried out between delivery of the precursor and delivery of the one or more reactants. Multiple ALD cycles are carried out to build up a film to a desired thickness.

PEALD and PECVD uses plasma to promote reaction between adsorbed precursor and reactant radicals. When plasma is ignited, ions and/or radicals of reactant gases may be generated to react with adsorbed precursors on the substrate. In PECVD, reactant gases may be continuously delivered to the substrate while the substrate is exposed to plasma. In PEALD, reactant gases are activated and the substrate is exposed to plasma during a conversion/reaction phase of an ALD cycle.

Silicon-containing films may be deposited by a vapor deposition technique such as CVD, PECVD, ALD, or PEALD. Silicon-containing films have various physical, chemical, electrical, and mechanical properties and are often used in semiconductor fabrication processes. For example, silicon nitride, silicon oxide, or silicon oxynitride films may be used as diffusion barriers, gate insulators, sidewall spacers, etch stop layers, dielectric films, and encapsulation layers. For example, conformal silicon nitride layers may be used in fabrication of memory structures. Conformal silicon nitride layers may be utilized in 3D memory structures such as vertical NAND flash memory structures that may employ high aspect ratios. Silicon nitride layers may be deposited with high conformality, low wet etch rate (WER) and/or low dry etch rate (DER), and high density, among other material properties.

Silicon-containing films such as silicon oxides, silicon nitrides, silicon carbides, silicon oxynitrides, silicon carbonitrides, silicon oxycarbides, and/or silicon oxycarbonitrides with desired properties may be obtained with the assistance of plasma and high operating temperatures in a suitable semiconductor processing apparatus. Plasma-assisted processes may speed up deposition rates and enable improved film properties (e.g., density). High temperatures may also accelerate deposition rates by shortening reaction completion times. Furthermore, certain chemical reactions may not take place unless the operating temperature is sufficiently high. Though some precursors may decompose at exceedingly high temperatures, other precursors may be selected for their ability to avoid decomposition and perform certain chemical reactions at such high temperatures.

It will be understood that the vapor deposition techniques of the present disclosure are not limited to silicon-containing films, but may be used to deposit other types of films such as nitrides, oxides, and oxynitrides.

To perform plasma-assisted, high-temperature vapor deposition processes, plasma processing apparatuses may be designed with a plasma-generating source and one or more heating elements. A substrate may be heated by one or more heating elements within a substrate support structure, such as a pedestal or electrostatic chuck ("ESC"). As used herein, the term "pedestal" is used to collectively refer to any substrate support structure, including an electrostatic chuck. Heating elements may generate heat that is conducted and/or radiated to the substrate. Additionally, the plasma-generating source may deliver energized ions and/or radicals to the substrate surface. In the plasma-generating source, reactant gases are introduced and plasma is generated by applying a strong radio-frequency (RF) electromagnetic field. In some implementations, the plasma generating source is a capacitively coupled plasma (CCP) reactor.

FIG. 1 shows a schematic illustration of an example semiconductor processing apparatus for performing deposition or etch according to some implementations. A semiconductor processing apparatus 100 of FIG. 1 has a single processing chamber 110 with a single substrate holder 118 (e.g., a pedestal or ESC) in an interior volume which may be maintained under vacuum or other desired chamber pressure by vacuum pump 130. A gas delivery system 102 and a showerhead 104 are also fluidically coupled to the chamber 110 for the delivery of film precursors, carrier and/or purge and/or process gases, secondary reactants, etc. Equipment for generating a plasma within the processing chamber 110 is also shown in FIG. 1. The semiconductor processing apparatus 100 schematically illustrated in FIG. 1 may be used for performing ALD or PEALD, although it may be adapted for performing other film deposition operations including CVD or PECVD.

The semiconductor processing apparatus 100 is depicted as a standalone process station having a process chamber body 110 for maintaining a low-pressure environment. However, it will be appreciated that a plurality of process stations may be included in a common process tool environment, e.g., within a common reaction chamber. It will be appreciated that, in some implementations, one or more hardware parameters of the semiconductor processing apparatus 100, including those discussed in detail herein, may be adjusted programmatically by one or more system controllers.

The semiconductor processing apparatus 100 fluidically communicates with gas delivery system 102 for delivering process gases, which may include liquids and/or gases, to a distribution showerhead 104. Gas delivery system 102 includes a mixing vessel 106 for blending and/or conditioning process gases for delivery to the showerhead 104. One or more mixing vessel inlet valves 108 and 108A may control introduction of process gases to mixing vessel 106.

Some reactants may be stored in liquid form prior to vaporization and subsequent to delivery to the processing chamber 110. The implementation of FIG. 1 includes a vaporization point 112 for vaporizing liquid reactant to be supplied to mixing vessel 106. In some implementations, vaporization point 112 may be a heated liquid injection module. In some other implementations, vaporization point 112 may be a heated vaporizer. In yet other implementations, vaporization point 112 may be eliminated from the semiconductor processing apparatus 100. In some implementations, a liquid flow controller (LFC) upstream of vaporization point 112 may be provided for controlling a mass flow of liquid for vaporization and delivery to processing chamber 110.

Showerhead 104 distributes process gases and/or reactants (e.g., film precursors) toward the substrate 114, the flow of which is controlled by one or more valves upstream from the showerhead (e.g., valves 108, 108A, and 116). In the implementation shown in FIG. 1, substrate 114 is located beneath showerhead 104, and is shown resting on an electrostatic chuck 118. Showerhead 104 may have any suitable shape, and may have any suitable number and arrangement of ports for distributing processes gases to substrate 114. In some implementations with two or more stations, the gas delivery system 102 includes valves or other flow control structures upstream from the showerhead, which can independently control the flow of process gases and/or reactants to each station such that gas may be flowed to one station but not another. Furthermore, the gas delivery system 102 may be configured to independently control the process gases and/or reactants delivered to each station in a multi-station apparatus such that the gas composition provided to different stations is different; e.g., the partial pressure of a gas component may vary between stations at the same time.

A chamber space 120 is located beneath showerhead 104. In some implementations, the electrostatic chuck 118 may be raised or lowered to expose the substrate 114 to chamber space 120 and/or to vary a volume of the chamber space 120. Optionally, the electrostatic chuck 118 may be lowered and/or raised during portions of the deposition process to modulate process pressure, reactant concentration, etc. within the chamber space 120.

In FIG. 1, the showerhead 104 and the electrostatic chuck 118 are electrically connected to RF power supply 122 and matching network 124 for powering a plasma. In some implementations, the plasma energy may be controlled (e.g., via a system controller having appropriate machine-readable instructions and/or control logic) by controlling one or more of a process station pressure, a gas concentration, an RF source power, an RF source frequency, and a plasma power pulse timing. For example, RF power supply 122 and matching network 124 may be operated at any suitable power to form a plasma having a desired composition of radical species. Likewise, RF power supply 122 may provide RF power of any suitable frequency and power. The semiconductor processing apparatus 100 also includes a DC power supply 126 that is configured to provide a direct current to the electrostatic chuck 118 in order to generate and provide an electrostatic clamping force to the electrostatic chuck 118 and the substrate 114. The electrostatic chuck 118 may also have one or more temperature control elements 128 that are configured to heat and/or cool the substrate 114.

In some implementations, the semiconductor processing apparatus 100 is controlled with appropriate hardware and/or appropriate machine-readable instructions in a system controller which may provide control instructions via a sequence of input/output control (IOC) instructions. In one example, the instructions for setting plasma conditions for plasma ignition or maintenance are provided in the form of a plasma activation recipe of a process recipe. In some cases, process recipes may be sequentially arranged, so that all instructions for a process are executed concurrently with that process. In some implementations, instructions for setting one or more plasma parameters may be included in a recipe preceding a plasma process. For example, a first recipe may include instructions for setting a flow rate of an inert (e.g., helium) and/or a reactant gas, instructions for setting a plasma generator to a power set point, and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure.

Figure 2:
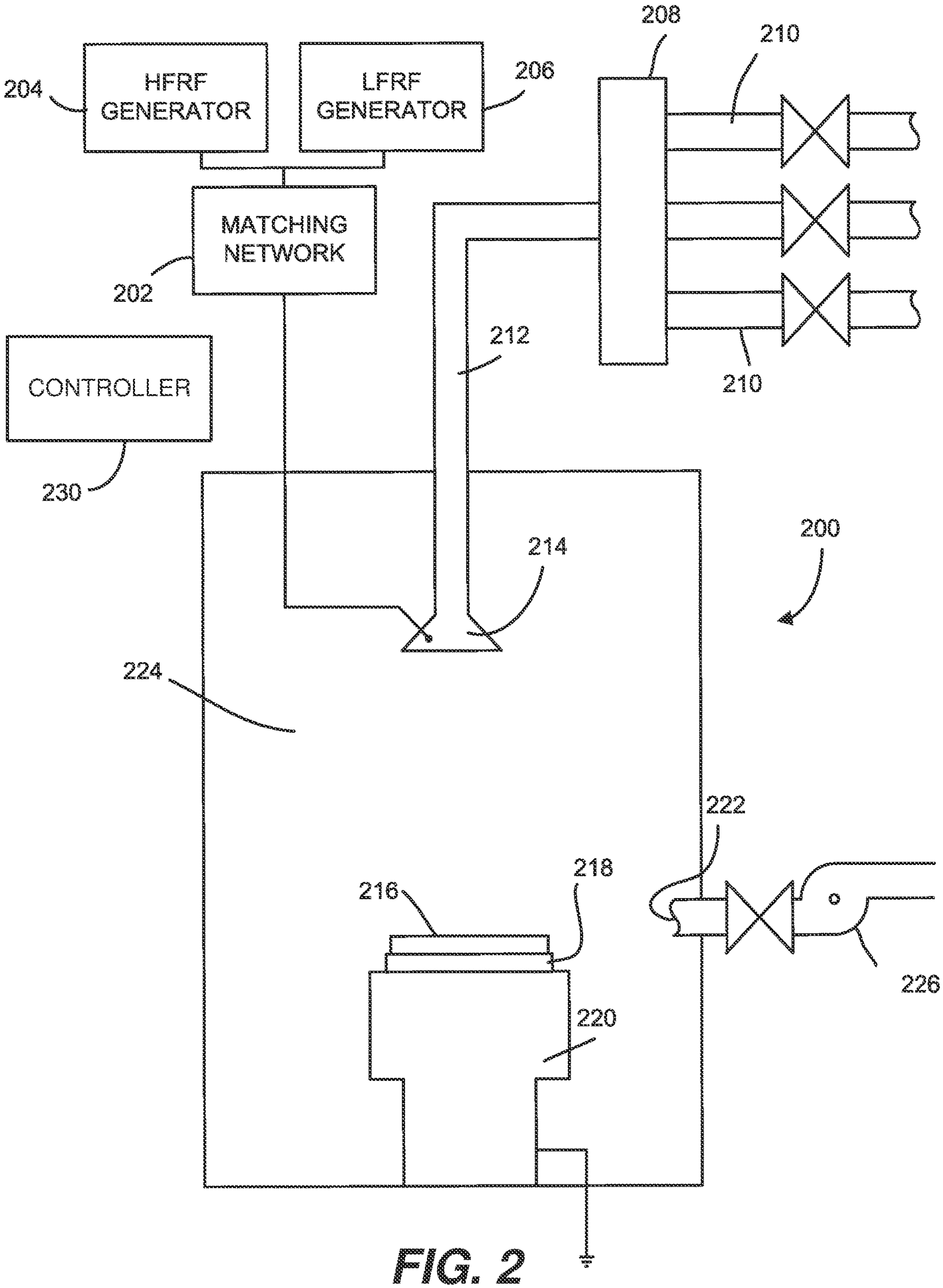
FIG. 2 shows a schematic illustration of an example plasma processing apparatus for carrying out deposition or etch according to some implementations.

FIG. 2 shows a schematic illustration of an example plasma processing apparatus for carrying out deposition or etch according to some implementations. As shown in FIG. 2, a plasma processing apparatus 200 includes a process chamber 224, which encloses other components of the plasma processing apparatus 200 and serves to contain the plasma. The plasma may be generated by a capacitive-discharge type system including a showerhead 214 working in conjunction with a grounded block 220. The process chamber 224 includes the showerhead 214 for delivering process gases into the process chamber 224. A high-frequency radio-frequency (HFRF) generator 204 may be connected to an impedance matching network 202, which is connected to the showerhead 214. In some implementations, a low-frequency radio-frequency (LFRF) generator 206 may be connected to the impedance matching network 202 to connect to the showerhead 214. The power and frequency supplied by the impedance matching network 202 is sufficient to generate a plasma from the process gas. In typical processes, a frequency generated by the HFRF generator 204 is between about 2-60 MHz, such as 13.56 MHz or 27 MHz. A frequency generated by the LFRF generator 206 is between about 250-400 kHz, such as 350 kHz or 400 kHz.

The process chamber 224 further includes a wafer support or pedestal 218. The pedestal 218 can support a wafer 216. The pedestal 218 can include a chuck, a fork, and/or lift pins to hold the wafer 216 during and between processing. In some implementations, the chuck may be an electrostatic chuck. The pedestal 218 may include one or more electrodes for providing electrostatic clamping force configured to retain the wafer 216. Heating elements (not shown) may be coupled to the pedestal 218 for controlling a temperature of the wafer 216.

Process gases are introduced via inlet 212. One or more source gas lines 210 can be connected to a manifold 208. The process gases may be premixed or not. Appropriate valving and mass flow control mechanisms are employed to ensure that the correct gases are delivered during deposition, etch, and other plasma treatment operations. Process gases may exit the process chamber 224 via an outlet 222. A vacuum pump 226 can typically draw process gases out and maintain a suitably low pressure within the process chamber 224.

As shown in FIG. 2, the plasma processing apparatus 200 is a capacitor type system where the showerhead 214 includes an electrode working in conjunction a grounded block 220. In other words, the plasma processing apparatus 200 is a CCP system and may be capable of supplying high-frequency RF power to the top of the process chamber 224, namely the showerhead 214. The bottom of the process chamber 224, namely the pedestal 218 and the block 220, is grounded.

The plasma processing apparatus 200 may include a controller 230 having instructions for controlling various process operations associated with the plasma processing apparatus 200. The controller 230 will typically include one or more memory devices and one or more processors communicatively connected with various process control equipment, e.g., valves, RF generators, substrate handling systems, heating elements, etc., and configured to execute the instructions so that the plasma processing apparatus 200 will perform various substrate processing operations.

Plasmas may be generated by applying an RF field to a low-pressure gas using two capacitively coupled plates in a CCP reactor. Ionization of the gas between the plates by the RF field ignites plasma. The generated plasma in the CCP reactor may be formed directly above the substrate surface.

Example CCP reactors may be illustrated in apparatuses 100 and 200 shown in FIGS. 1 and 2, respectively. Electrostatic chucks are often employed in conjunction with semiconductor processing apparatuses having CCP reactors for ease of dechucking wafers from the electrostatic chucks.

Electrostatic chucks provide a clamping force to hold or retain a wafer when voltage is applied to clamping electrode(s) in the electrostatic chuck. Upon removal of the applied voltage, clamping force is expected to go to zero, upon which the wafer can be easily removed. However, buildup of materials or byproducts from plasma processing formed on the surface of the electrostatic chuck can lead to charge trapping on the surface of the electrostatic chuck, resulting in residual sticking force on the wafer even after the applied voltage is turned off. This can lead to numerous problems such as wafer popping, particle generation, and even wafer breakage. To neutralize the attractive force between the wafer and the electrostatic chuck, the wafer can be grounded and discharged. Wafer discharging can occur by running a plasma of a non-process gas or low density plasma in the CCP reactor. Accordingly, electrostatic chucks are frequently used in conjunction with CCP reactors.

Plasma reactors may alternatively use a ceramic pedestal instead of an electrostatic chuck. A "ceramic pedestal" as used herein refers to a substrate support structure made of ceramic material(s) and does not use electrostatic clamping forces to retain a substrate. For example, ceramic pedestals may use mechanical forces, vacuum forces, or other mechanisms for retaining a substrate. It will be understood that "electrostatic chucks" may also be made of ceramic material(s) but use electrostatic clamping forces to retain a substrate. Indirect non-CCP reactors such as remote plasma reactors often employ ceramic pedestals rather than electrostatic chucks due to problems associated with dechucking, among other potential problems. Ceramic pedestals can generally withstand high temperature environments and corrosive environments (e.g., environments containing halogen gases such as fluorine) during substrate processing while providing high thermal conductivity.

Figure 3:
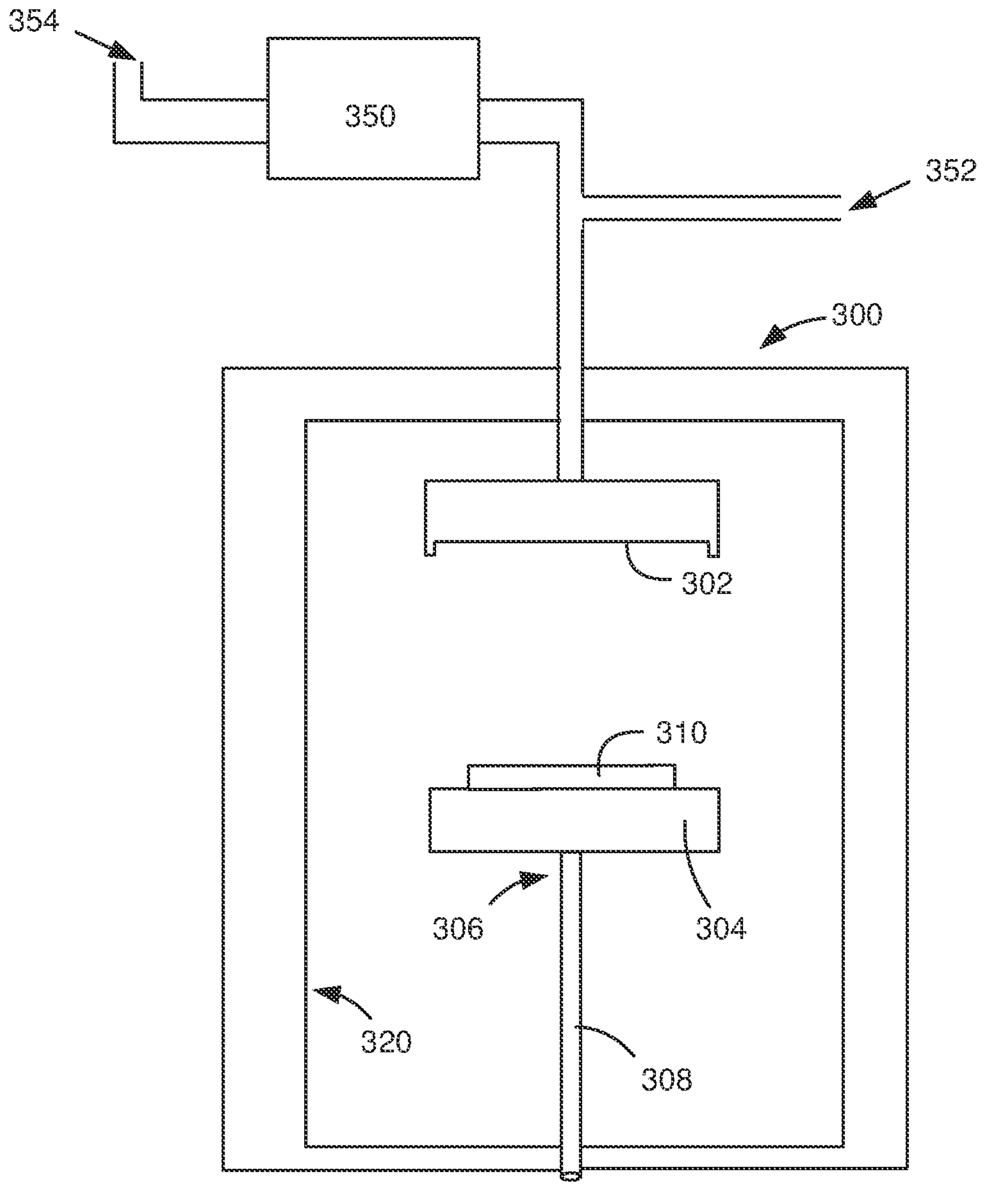
FIG. 3 shows a schematic illustration of an example plasma processing apparatus utilizing a ceramic pedestal for holding a semiconductor substrate.

FIG. 3 shows a schematic illustration of an example plasma processing apparatus utilizing a ceramic pedestal for holding a semiconductor substrate. As shown in FIG. 3, the plasma processing apparatus 300 includes a remote plasma source 350 for generating plasma and a reaction chamber 320 for processing a substrate 310. Plasma is generated upstream of the reaction chamber 320 to provide indirect (remote) plasma exposure to the substrate 310. Gas line 354 may be fluidly coupled to the remote plasma source 350 for supplying reactant gases for remote plasma generation. Plasma-activated species may be supplied from the remote plasma source 350 to the reaction chamber 320 via a showerhead 302. In some implementations, other process gas(es) and/or carrier gas(es) may be delivered to the reaction chamber 320 from gas line 352 through the showerhead 302. The substrate 310 is supported by a ceramic pedestal 306 including a platen 304 connected to a stem 308. The substrate 310 is retained and held in place by the ceramic pedestal 306 during substrate processing. In some implementations, the plasma processing apparatus 300 can perform remote plasma CVD or remote plasma ALD. In some implementations, the plasma processing apparatus 300 may expose the substrate 310 to elevated temperatures such as temperatures greater than about 400° C. or greater than about 500° C. The ceramic pedestal 306 can support high temperature conditions and withstand harsh environments produced by the remote plasma CVD or remote plasma ALD.

However, ceramic pedestals may suffer from several drawbacks. For one, a semiconductor substrate being processed in a plasma reactor may be bowed, warped, or distorted. As layers of films are stacked on top of each other during fabrication, more stress is introduced to the semiconductor substrate which can cause bowing. This can lead to non-uniform contact between the semiconductor substrate and the ceramic pedestal. Substrate bowing can potentially be on the order between about ±200 μm and about ±1000 μm. This can lead to regions of the substrate being significantly further away from the pedestal surface, resulting in thermal non-uniformities and/or deposition non-uniformities. Furthermore, substrate bowing can be attributable to unwanted backside deposition. This can be caused by poor edge sealing around a circumference of the substrate, resulting in unwanted reactant or precursor gases penetrating underneath the substrate and depositing on the backside of the substrate. This can further exacerbate substrate bowing and cause wafer processing issues in subsequent operations. In addition, wafer handling can be adversely affected by ceramic pedestals. In some cases, the cyclical nature of ALD processes can result in the gases and chamber pressure changing rapidly and constantly. This means that gas transitions are frequently occurring underneath the semiconductor substrate. The semiconductor substrate may become off-centered with respect to the rest of the process chamber, pushed aside, or even pushed off of the ceramic pedestal altogether. This wafer movement can lead to deposition non-uniformities or even cause unwanted backside scratches on the semiconductor substrate.

Remote Plasma Deposition with Electrostatic Chucking

The present disclosure provides an electrostatic chuck in a remote plasma processing apparatus. A substrate pedestal in a reaction chamber of the remote plasma processing apparatus supports a semiconductor substrate, where the substrate pedestal includes the electrostatic chuck. The remote plasma processing apparatus may be configured to dechuck the substrate by applying a sequence of reversing polarities and reducing clamping voltages. The substrate pedestal includes one or more heating elements for heating the semiconductor substrate to an elevated temperature between about 300° C. and about 750° C. or between about 500° C. and about 700° C. The remote plasma processing apparatus includes a remote plasma source for generating plasma, where the remote plasma source is located upstream of the reaction chamber. The remote plasma processing apparatus further includes one or more gas inlets for delivering reactant gases and/or precursor gases in a remote plasma CVD or remote plasma ALD process. The remote plasma processing apparatus may be configured to deposit silicon-containing films such as silicon nitride, silicon oxide, silicon carbide, silicon oxynitride, silicon oxycarbide, silicon carbonitride, and silicon oxycarbonitride. For depositing silicon nitride film by a remote ALD process, an amount of amine radicals generated in the remote plasma source may be controlled relative to an amount of hydrogen radicals and/or nitrogen radicals for optimizing film properties of the silicon nitride. Precursors for depositing silicon nitride film are delivered downstream from the remote plasma source rather than routed through the remote plasma source. The silicon nitride film may be deposited with high step coverage and substantially uniform film properties in features of the semiconductor substrate.

In some alternative implementations, the present disclosure provides an electrostatic chuck in a thermal ALD apparatus. The electrostatic chuck may include one or more heating elements for heating the semiconductor substrate to an elevated temperature between about 300° C. and about 750° C. or between about 500° C. and about 700° C. Accordingly, though the electrostatic chuck of the present disclosure is generally described in the context of remote plasma deposition, it will be understood that the electrostatic chuck may be provided in the context of thermal ALD for depositing films such as silicon-containing films at elevated temperatures.

Figure 4:
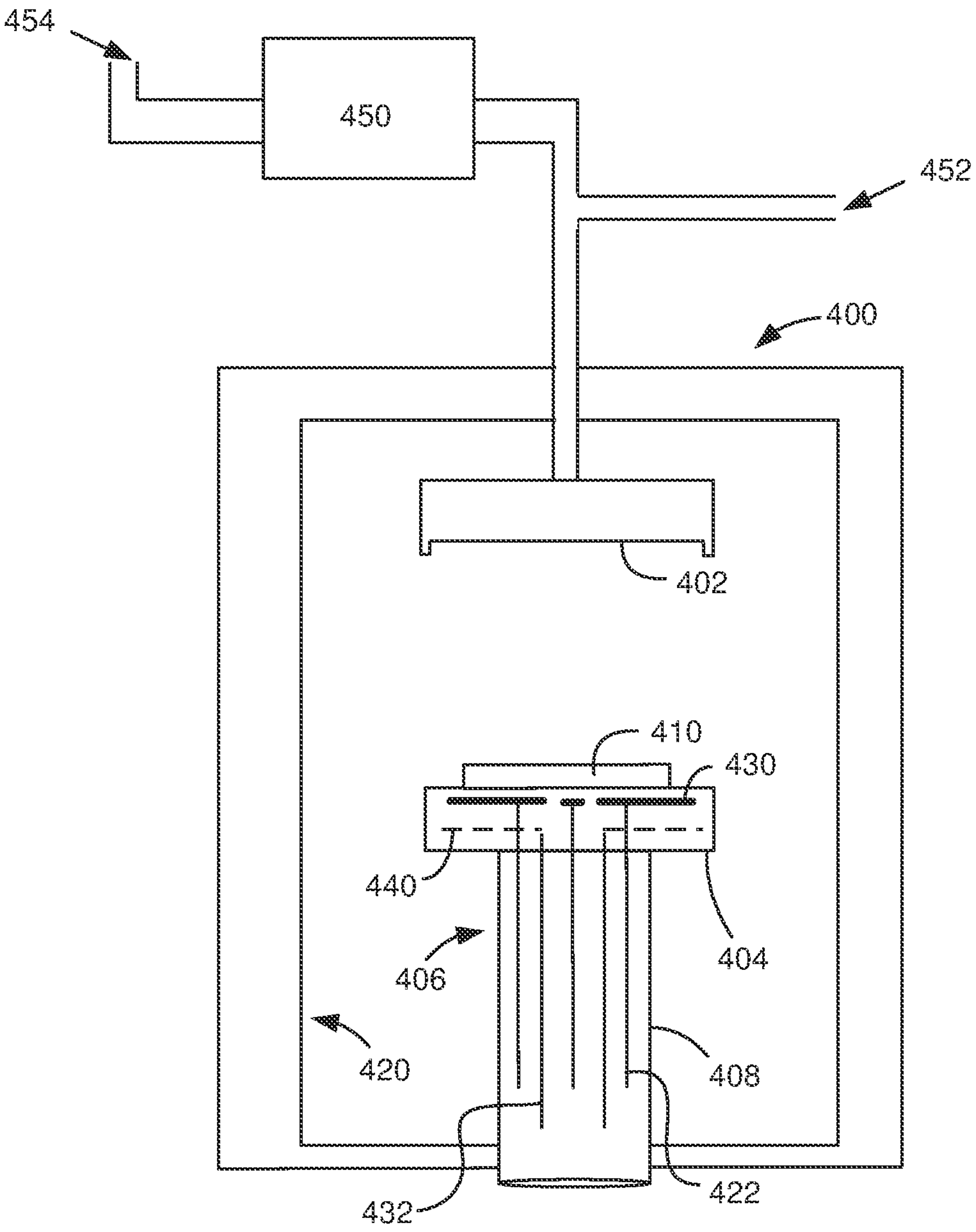
FIG. 4 shows a schematic illustration of an example plasma processing apparatus utilizing an electrostatic chuck for retaining a semiconductor substrate according to some implementations.

FIG. 4 shows a schematic illustration of an example plasma processing apparatus utilizing an electrostatic chuck for retaining a semiconductor substrate according to some implementations. As shown in FIG. 4, the plasma processing apparatus 400 includes a remote plasma source 450 for generating plasma and a reaction chamber 420 for processing a substrate 410. Plasma is generated upstream of the reaction chamber 420 to provide indirect (remote) plasma exposure to the substrate 410. Plasma-activated species may be supplied from the remote plasma source 450 to the reaction chamber 420 via a showerhead 402. In some implementations, process gas(es) and/or carrier gas(es) may be delivered to the reaction chamber 420 from gas line 452 through the showerhead 402. The substrate 410 is supported by a substrate pedestal 406 including a platen 404 and a stem 408 connected to an underside of the platen 404. The platen 404 may be a pedestal base and the stem 408 may be a support column, where the pedestal base is positioned on top of the support column. The substrate pedestal 406 may be an electrostatic chuck for retaining the substrate 410 by electrostatic attractive forces. In some implementations, the plasma processing apparatus 400 can perform remote plasma CVD or remote plasma ALD. In some implementations, the plasma processing apparatus 400 may expose the substrate 410 to elevated temperatures such as temperatures greater than about 300° C., greater than about 400° C., greater than about 500° C., between about 300° C. and about 750° C., or between about 500° C. and about 700° C. The substrate pedestal 406 can support high temperature conditions and withstand harsh environments produced by the remote plasma CVD or remote plasma ALD.

The substrate pedestal 406 is positioned within an interior of the reaction chamber 420. The platen 404 includes a surface for supporting the substrate 410. The platen 404 includes electrodes 430 that may be embedded within a ceramic body of the platen 404. The electrodes 430 may include one or more clamping electrodes and optionally one or more RF electrodes, where the one or more clamping electrodes may receive power to clamp the substrate 410 by electrostatic attractive forces. Power may be supplied to the electrodes 430 via one or more electrical lines 422 embedded in the substrate pedestal 406. The platen 404 further includes heating elements 440, such as resistive heaters, configured to generate heat and control a temperature of the substrate 410. For instance, the heating elements 440 may heat the substrate 410 to temperatures greater than about 450° C., greater than about 500° C., greater than about 550° C., greater than about 600° C., or greater than about 650° C. Power may be supplied to the heating elements 440 via one or more power lines 432 embedded in the substrate pedestal 406.

In some embodiments, the electrodes 430 may be coplanar or substantially coplanar. The electrodes 430 may include one or more pairs of clamping electrodes having opposite polarities. In some embodiments, an outer ring-shaped RF electrode may surround the one or more pairs of clamping electrodes. The outer ring-shaped RF electrode may further include a radially extending lead or power feed strip that extends diagonally across the outer ring-shaped RF electrode. This allows a terminal to be connected at or near a center of the platen 404 to power the outer ring-shaped RF electrode. The outer ring-shaped RF electrode serves to minimize undesirable inductance effects that would otherwise be created by embedded power distribution circuits, and also serves to minimize adverse effects of disturbances to an RF field above the substrate 410 being processed. In some embodiments, the electrodes 430 include one or more clamping electrodes powered by a DC power source to provide DC chucking voltage (e.g., between about 200 V to about 2000 V), and the electrodes 430 further includes at least one outer ring-shaped RF electrode powered by an RF power source to provide RF bias voltage (e.g., one or more frequencies of about 400 kHz to about 60 MHz at power levels of about 50 W to about 3000 W), and the electrodes 430 may optionally include at least one electrode powered by DC and RF power sources via suitable circuitry.

In some embodiments, an inside of the stem 408 may include electrical lines 422, 432. First electrical lines 422 may power the electrodes 430 and second electrical lines 432 may power the heating elements 440. Some portions of the stem 408 may be hollow to house the electrical lines 422, 432. In some cases, channels or tubes (not shown) may extend through the stem 408 to provide a gas passage to an upper surface of the platen 404. The gas passage may facilitate delivery of an inert gas, heat transfer gas, or other gas to an underside of the substrate 410 being supported on the platen 404.

In some embodiments, the substrate pedestal 406 includes ceramic material(s) such as aluminum oxide (alumina), aluminum nitride, aluminum oxynitride, yttria, boron nitride, silicon oxide, silicon carbide, silicon nitride, titanium oxide, zirconium oxide, or other suitable ceramic material. For example, the substrate pedestal 406 can be made of an aluminum-containing material, where the aluminum-containing material comprises alumina, aluminum nitride, aluminum oxynitride, or combinations thereof. The platen 404 and the stem 408 may be made of any of the foregoing ceramic materials, where a bottom surface of the platen 404 may be joined to an upper surface of the stem 408 by brazing, friction welding, diffusion bonding, or other suitable technique.

Plasma generated in the remote plasma source 450 may include radicals and/or ions of a process gas. An RF power supply (not shown) may be coupled to the remote plasma source 450 to ignite and sustain plasma in the remote plasma source 450. In some embodiments, the RF power supply may be configured to control high- and low-frequency RF power sources independently of one another. Example low-frequency RF frequencies may include but are not limited to frequencies between about 0 kHz and about 500 kHz. Example high-frequency RF frequencies may include but are not limited to frequencies between about 1.8 MHz and about 2.45 GHz, or equal to or greater than about 13.56 MHz, equal to or greater than about 27 MHz, equal to or greater than about 30 MHz, or equal to or greater than about 60 MHz. It will be appreciated that any suitable parameters may be modulated discretely or continuously to provide plasma energy for surface reactions. In some embodiments, the RF power supply is configured to supply plasma power in a range between about 500 W and about 15 KW per station, between about 2 kW and about 10 KW per station, or between about 3 kW and about 8 KW per station, such as about 6.5 kW per station. High plasma power may be supplied and controlled to generate amine radicals, nitrogen radicals, and/or hydrogen radicals in a remote plasma. In some embodiments, a coil (not shown) may be positioned around an outer wall (e.g., quartz dome) of the remote plasma source 450 to provide inductively-coupled plasma (ICP) generation. In some instances, the RF power supply is electrically coupled to the coil via an impedance matching network. However, it will be understood that the remote plasma source 450 may alternatively be equipped to provide capacitively-coupled plasma (CCP) generation.

Gas lines 452, 454 may supply precursor gas(es), reactant gas(es), inert gas(es), or other gas(es) to the plasma processing apparatus 400. Process gases delivered through the gas lines 452, 454 participate in gas phase reactions for depositing films in ALD or CVD processes. These films may include, for example, silicon-containing films such as silicon oxide or silicon nitride. Gas line 454 may be fluidly coupled to the remote plasma source 450 for supplying reactant gases for remote plasma generation, and gas line 452 may be fluidly coupled to the reaction chamber 420 for supplying precursor gases. The gas line 452 may be positioned downstream of the remote plasma source 450. This separates delivery of the reactant gases from the precursor gases. In some embodiments, precursor gases may include silicon-containing precursor gases. In some embodiments, reactant gases may include oxygen ($O_2$), ozone ($O_3$), carbon dioxide ($CO_2$), carbon monoxide (CO), nitrous oxide ($N_2O$), water ($H_2O$), methanol ($CH_3OH$), hydrazine ($N_2H_4$), nitrogen ($N_2$), ammonia ($NH_3$), hydrogen ($H_2$), or combinations thereof. For example, the reactant gases may include a mixture of nitrogen, hydrogen, and ammonia.

In some implementations of the present disclosure, silicon-containing films may be deposited by ALD. ALD is a technique that deposits thin layers of material using sequential self-limiting reactions. Typically, an ALD cycle includes operations to deliver and adsorb at least one precursor to the substrate surface, and then react the adsorbed precursor with one or more reactants to form the partial layer of film. As an example, a silicon nitride ALD cycle may include the following operations: (i) delivery/adsorption of a silicon-containing precursor, (ii) purging of silicon-containing precursor from the chamber, (iii) plasma exposure of nitrogen-containing reactant(s), and (iv) purging of plasma-activated species from the chamber. Other types of films may be deposited using pulses of various precursors and co-reactants.

Figure 5:
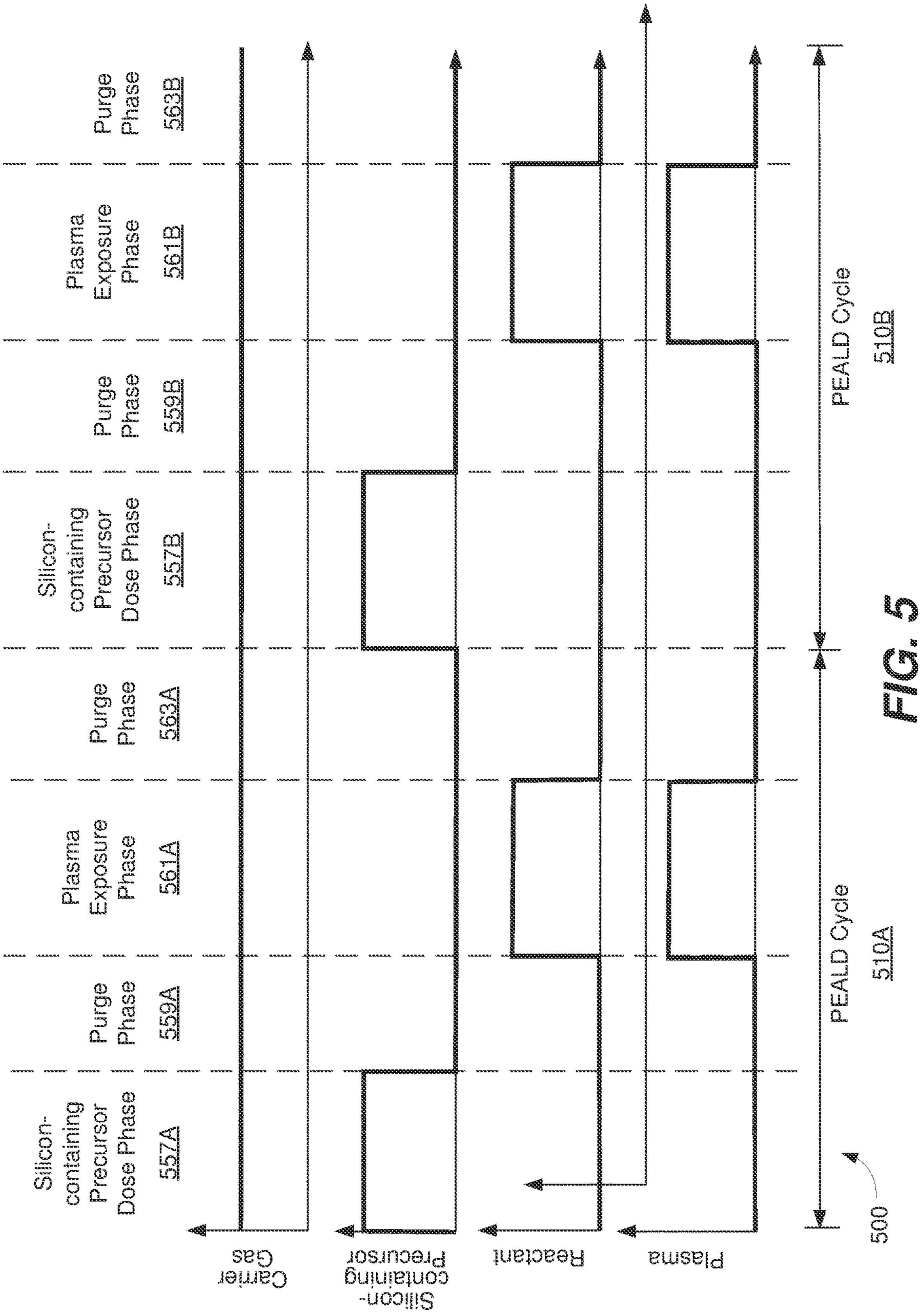
FIG. 5 illustrates an example timing sequence diagram showing plasma-enhanced atomic layer deposition (PEALD) cycles for depositing a silicon-containing film according to some implementations.

FIG. 5 illustrates an example timing sequence diagram showing plasma-enhanced atomic layer deposition (PEALD) cycles for depositing a silicon-containing film according to some implementations. FIG. 5 shows phases in a typical PEALD process 500 for various process parameters, such as carrier gas or purge gas flow, plasma, silicon-containing precursor flow, and reactant gas flow. Each of the ALD cycles in FIG. 5 may represent a PEALD cycle. The lines indicate when the flow is turned on and off, or when plasma is turned on and off. Example process parameters include but are not limited to, flow rates for inert and reactant species, plasma power and frequency, wafer temperature, and process chamber pressure.

As shown in FIG. 5, during the PEALD cycle 510A, a substrate in a process chamber is exposed to a silicon-containing precursor during a dose phase 557A. In some implementations, the silicon-containing precursor includes a silane moiety having one or more halogen substituents attached to the silane moiety, such as, dichlorosilane (DCS), hexachlorodisilane (HCDS), tetrachlorosilane ($SiCl_4$), trichlorosilane ($SiHCl_3$), or other halosilane. In some implementations, the silicon-containing precursor includes a silane or disilane. During the dose phase 557A, plasma is turned off, reactant gas flow is turned off, and a carrier gas may be flowed towards the substrate. However, it will be understood that the substrate may be heated to an elevated temperature during the dose phase 557A. In some implementations, the substrate may be exposed to the silicon-containing precursor during the dose phase 557A for a duration between about 0.1 seconds and about 100 seconds, between about 0.2 seconds and about 50 seconds, or between about 0.3 seconds and about 10 seconds, depending on the flow rate and substrate surface area. In some implementations, a flow rate of the silicon-containing precursor may be between about 50 sccm and about 5000 sccm, between about 100 sccm and about 2000 sccm, or between about 200 sccm and about 1500 sccm. In some implementations, a chamber pressure in the process chamber is between about 0.5 Torr and about 40 Torr, or between about 1 Torr and about 30 Torr. During the dose phase 557A, the substrate may be exposed to elevated temperatures such as temperatures between about 300° C. and about 750° C. or between about 500° C. and about 700° C. In some implementations, the silicon-containing precursor adsorbs onto the surface of the substrate in a self-limiting manner such that once active sites are occupied by the silicon-containing precursor, little or no additional silicon-containing precursor will be adsorbed on the surface of the substrate. When the silicon-containing precursor adsorbs onto active sites of the surface of the substrate, a thin layer of the silicon-containing precursor forms on the surface.

In some implementations, the process chamber may be purged between operations of exposing the substrate to the silicon-containing precursor and exposing the substrate to remote plasma. In addition, the plasma processing chamber may be purged after exposing the substrate to the remote plasma. Purging may involve a sweep gas, which may be a carrier gas used in other operations/phases or a different gas. Purging may remove excess species in the vapor phase that did not adsorb or react on the surface of the substrate. As shown in FIG. 5, the process chamber undergoes purging during purge phases 559A and 563A. Silicon-containing precursor flow is turned off, plasma is turned off, and reactant gas flow is turned off. However, the carrier gas may continue to flow towards the substrate. In some implementations, the purge phases 559A and 563A may each include one or more evacuation sub-phases for evacuating the process chamber. Alternatively, it will be appreciated that each of the purge phases 559A and 563A may be omitted in some implementations. Each purge phase 559A and 563A may have a suitable duration, such as between about 0 seconds and about 60 seconds, between about 0.1 seconds and about 20 seconds, or between about 1 second and about 15 seconds. In some implementations, each purge phase 559A and 563A may flow a purge gas such as nitrogen ($N_2$). In some implementations, a flow rate of the purge gas may be between about 500 sccm and about 80000 sccm, between about 1000 sccm and about 40000 sccm, or between about 2000 sccm and about 20000 sccm. In some implementations, a chamber pressure in the process chamber during each purge phase 559A and 563A is between about 0.2 Torr and about 50 Torr, between about 0.5 Torr and about 40 Torr, or between about 1 Torr and about 30 Torr. However, it will be understood that lower pressures may be used to more effectively purge the process chamber.

As shown in FIG. 5, during the PEALD cycle 510A, the substrate may be exposed to remote plasma generated from a source of reactant gas during a plasma exposure phase 561A. The plasma exposure phase 561A may also be referred to as a conversion phase. Plasma is turned on in a remote plasma source during plasma exposure phase 561A so that remote plasma is ignited. The remote plasma may include ions, radicals, charged neutrals, and other reactive species of the reactant gas. The reactive species may react with the adsorbed silicon-containing precursor to form a silicon-containing film. For instance, the reactive species may include radical species of nitrogen, ammonia, and/or hydrogen (N*, $NH_2$*, NH*, and/or H*) that react with the adsorbed silicon-containing precursor to deposit silicon nitride film. Flow of the silicon-containing precursor is turned off while flow of the reactant gas is turned on during the plasma exposure phase 561A. Carrier gas may or may not continue to flow during plasma exposure phase 561A. In some implementations, the substrate may be exposed to the remote plasma for a duration between about 0.5 seconds and about 200 seconds, between about 1 second and about 120 seconds, or between about 2 seconds and about 80 seconds. In some implementations, when depositing silicon nitride film, a flow rate of nitrogen may be between about 5000 sccm and about 40000 sccm, a flow rate of ammonia may be between about 0 sccm and about 5000 sccm, and a flow rate of hydrogen may be between about 0 sccm and about 5000 sccm. In some implementations, a chamber pressure of the process chamber may be between about 0.1 Torr and about 50 Torr, between about 0.25 Torr and about 25 Torr, or between about 0.5 Torr and about 20 Torr. In some implementations, an RF power applied to the remote plasma source for plasma generation is between about 500 W and about 15 KW per station, between about 1 kW and about 10 KW per station, or between about 2 kW and about 10 KW per station. During the plasma exposure phase 561A, the substrate may be exposed to elevated temperatures such as temperatures between about 300° C. and about 750° C. or between about 500° C. and about 700° C. While the pedestal temperature generally stays constant during each of the phases of the PEALD cycle 510A, substrate temperature may still fluctuate as a product of changes in pressure, flow rate, and showerhead gap.

Performing operations 557A, 559A, 561A, and 563A may constitute an ALD cycle 510A. Performing operations 557B, 559B, 561B, and 563B may constitute another ALD cycle 510B. Multiple ALD cycles 510A, 510B may be repeated until a desired film thickness of the silicon-containing film is achieved.

An electrostatic chuck may be incorporated in a remote plasma processing apparatus in the present disclosure. Ordinarily, electrostatic chucks depend on direct plasma exposure to assist in dechucking. Direct plasma exposure for dechucking is typically employed in CCP-based plasma processing apparatuses. However, a remote plasma processing apparatus of the present disclosure includes an electrostatic chuck and is configured to perform a dechucking routine without direct plasma exposure. In some embodiments, the remote plasma processing apparatus is configured to perform remote plasma ALD operations for depositing silicon-containing films or for depositing oxide films, nitride films, or oxynitride films, is configured to operate at elevated temperatures, and is configured to employ corrosive chemistries such as halosilanes. The electrostatic chuck may ensure that the substrate being processed is secure, flattened, and sealed around its edges. As more and more layers are stacked on top of one another during semiconductor fabrication, more stress is introduced that may cause wafer bowing. Electrostatic chucks may flatten and secure the substrate to reduce adverse effects of wafer bowing during processing. By flattening the substrate, contact between the substrate pedestal and the substrate is improved. Moreover, wafer mishandling is reduced by having the substrate secured in place even during numerous gas transitions. Unwanted backside scratches can be prevented with the electrostatic chuck, and unwanted backside deposition can be prevented with an electrostatic chuck seal band that seals around the edges of the substrate.

In some alternative implementations, an electrostatic chuck of the present disclosure may be incorporated in a thermal ALD apparatus. The thermal ALD apparatus is configured to perform thermal ALD operations for depositing silicon-containing films or for depositing oxide films, nitride films, or oxynitride films, is configured to operate at elevated temperatures, and is configured to employ corrosive chemistries such as halosilanes.

Figure 6A:
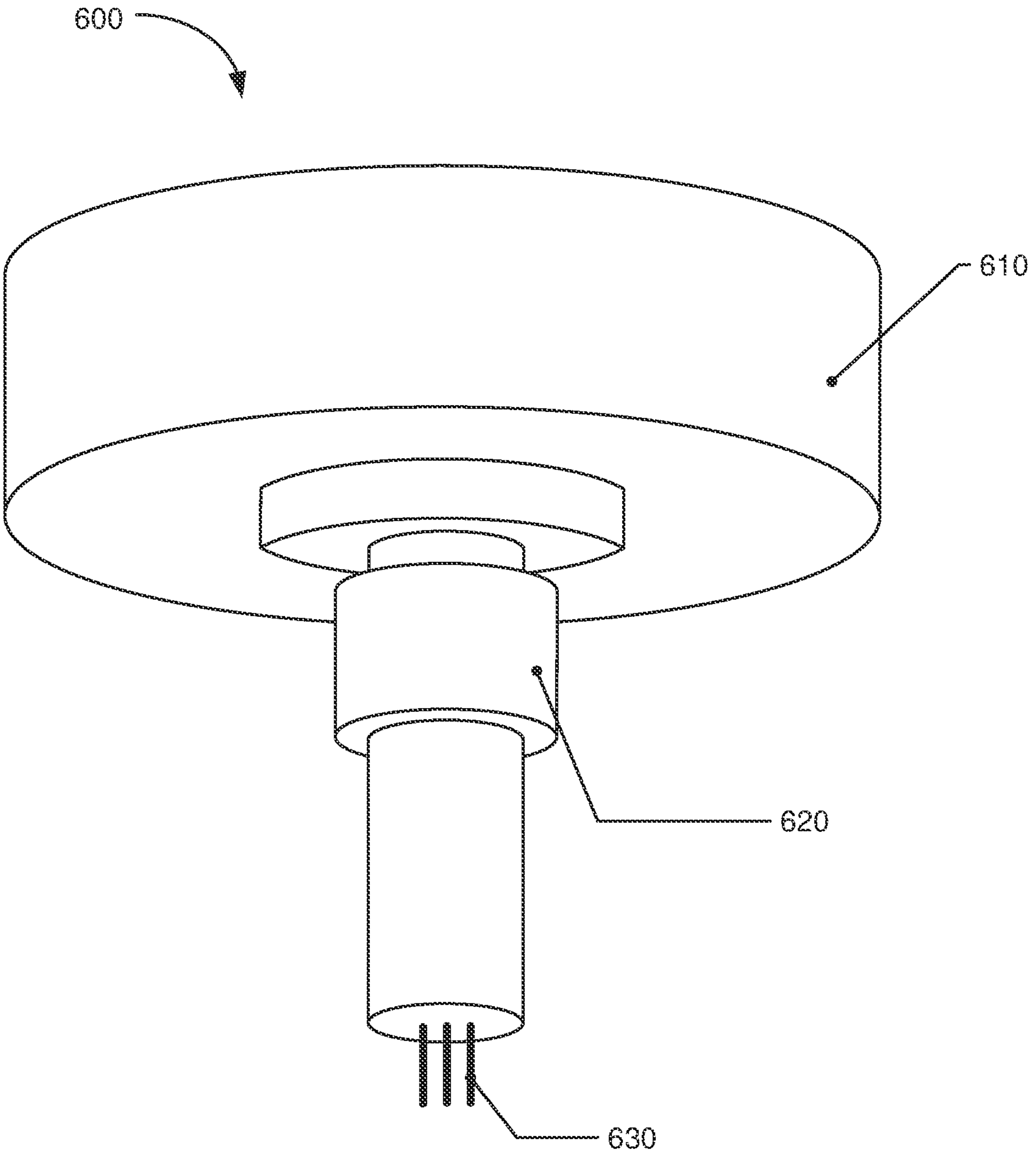
FIG. 6A shows a perspective view schematic illustration of an example substrate support structure including an electrostatic chuck according to some implementations.

FIG. 6A shows a perspective view schematic illustration of an example substrate support structure including an electrostatic chuck according to some implementations. A substrate support structure 600 may be referred to as a wafer pedestal or substrate pedestal. The substrate support structure 600 includes a platen or electrostatic chuck 610 on which a semiconductor substrate is held. The electrostatic chuck 610 is connected to a stem 620. In some embodiments, the electrostatic chuck 610 is disk-shaped and positioned on the stem 620 that is tubular-shaped. Each of the electrostatic chuck 610 and the stem 620 of the substrate support structure 600 incorporates ceramic materials such as alumina, aluminum nitride, aluminum oxynitride, yttria, boron nitride, silicon oxide, silicon carbide, silicon nitride, titanium oxide, zirconium oxide, or other suitable ceramic material.

The electrostatic chuck 610 includes clamping electrode (s) (not shown) embedded within a ceramic body. The clamping electrode(s) may be electrostatically charged by applying a direct current (DC) voltage so that the clamping electrode(s) and the semiconductor substrate act as a capacitive circuit to hold the semiconductor substrate in place. The clamping electrode(s) are typically thin, planar structures that are parallel to the overall plane of the semiconductor substrate. A dielectric layer or other insulator may be interposed between the clamping electrode(s) and the semiconductor substrate, which prevents a short circuit and protects the clamping electrode(s) from exposure to a processing environment. In some implementations, the electrostatic chuck 610 further includes heating elements (not shown) for heating the semiconductor substrate to elevated temperatures.

Electrical power lines 630 may supply electrical current to power the heating elements and/or electrodes. The stem 620 may be a hollow connecting tube adapted to carry the electrical power lines 630. In some instances, the ceramic stem 620 may be a thin-walled small-diameter tube that connects to the electrostatic chuck 610. In some implementations, the interior of the stem 620 or the interior of the electrical power lines 630 (e.g., hollow electrical feed rods) may have cavities for delivery of gas to an underside of the semiconductor substrate supported on the substrate support structure 600.

Figure 6B:
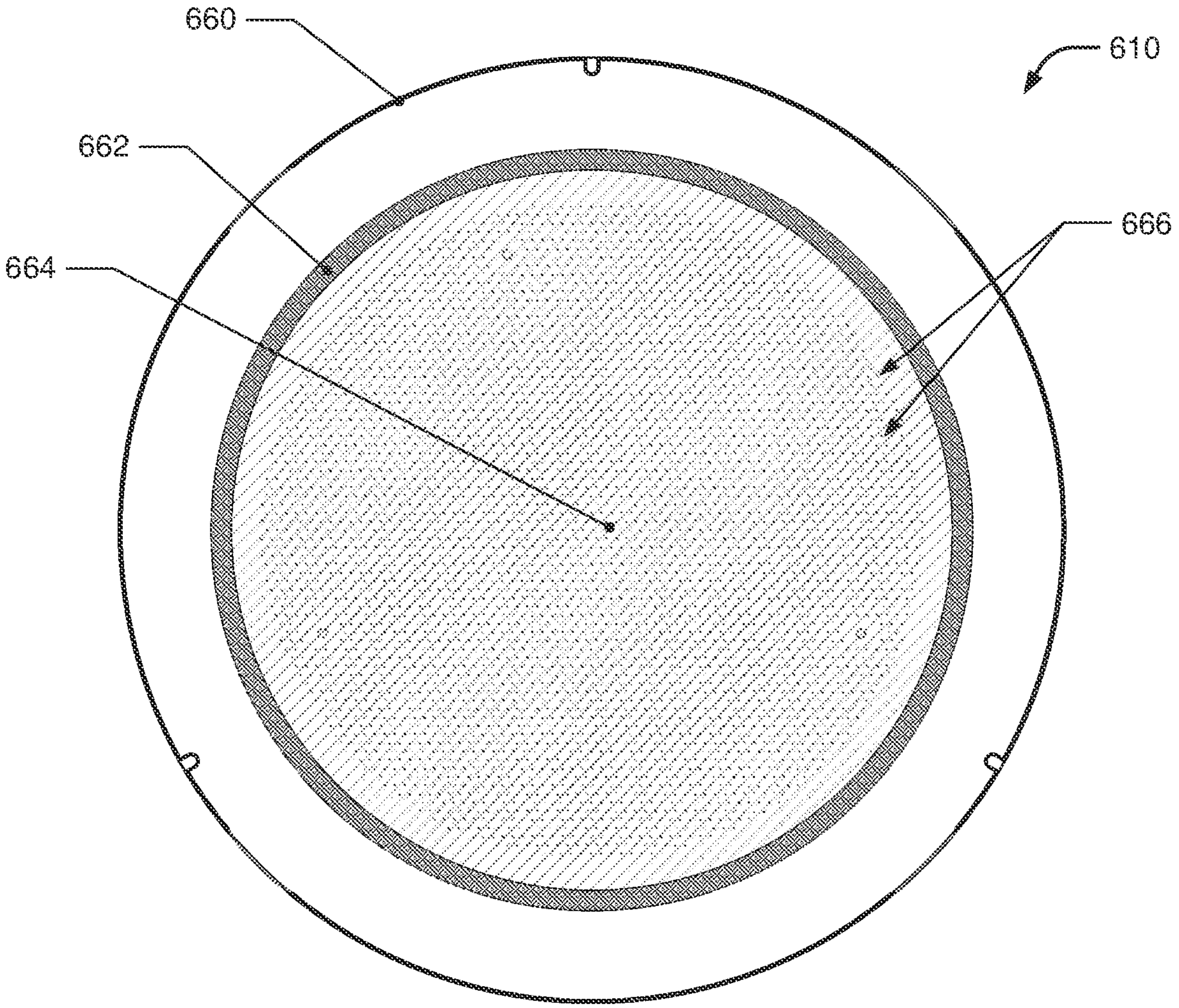
FIG. 6B shows a top view schematic illustration of an example electrostatic chuck according to some implementations.

FIG. 6B shows a top view schematic illustration of an example electrostatic chuck according to some implementations. The electrostatic chuck 610 has a body 660 which includes an upper annular seal surface 662, a recess 664 depicted in semi-transparent cross-hatching, and a plurality of micro-contact areas ("MCAs") 666 arranged within the recess 664. The upper annular seal surface 662 is a circumferential ring or seal band that extends completely around the recess 664. The upper annular seal surface 662 is configured to support the edge and a portion of the underside or backside of a substrate. The upper annular seal surface 662 is a flat, planar, and smooth surface which at least partly enables a seal to be created between the backside of the substrate and the upper annular seal surface 662.

In order to prevent the process gases and other material from flowing to the underside of the substrate, a seal between the underside of the substrate and the upper annular seal surface 662 may be created in an area beginning at the edge of the underside of the substrate and extending radially inwards towards a vertical center axis of the body 660 of the electrostatic chuck 600. With the seal occurring at the edge of the substrate, gases and other material are not able to flow under the substrate. The application of a downward electrostatic clamping force may assist in causing the edge of the underside of the substrate, and a portion of the underside of the substrate, to contact and create the seal with the upper annular seal surface 662. The substrate is centered over the recess 664 and supported by the plurality of MCAs 666 and the upper annular seal surface 662. When the electrostatic clamping electrodes are powered to cause a downward electrostatic clamping force to be applied on the substrate, the seal is created between the upper annular seal surface 662 and the portion of the substrate contacting the upper annular seal surface 662.

The body 660 may include one or more electrostatic clamping electrodes (not shown) that are configured to cause a downward clamping force to be applied to the substrate when the substrate is supported by the electrostatic chuck 600 and when power is applied to the one or more electrostatic clamping electrodes. In some embodiments, the one or more electrostatic clamping electrodes may be configured to apply an electrostatic clamping force or pressure between about 1 Torr and about 40 Torr (e.g., between about 0.02 psi and about 0.8 psi). In some embodiments, the one or more electrostatic clamping electrodes are positioned below a lower recess surface of the recess 664.

Along with the upper annular seal surface 662, the plurality of MCAs 666 are configured to support the substrate that is positioned on the electrostatic chuck 600 to prevent undesired deformation when the substrate is subjected to a downward electrostatic clamping force. Undesirable deformation is minimized where there are a sufficient number of MCAs 666 in adequate arrangement to equally and adequately distribute the pressure of the downward electrostatic clamping force. In some embodiments, the plurality of MCAs 666 protrude from the lower recess surface of the recess 664. A top surface of each MCA 666 may be coplanar with a top surface of the upper annular seal surface 662.

Figure 7:
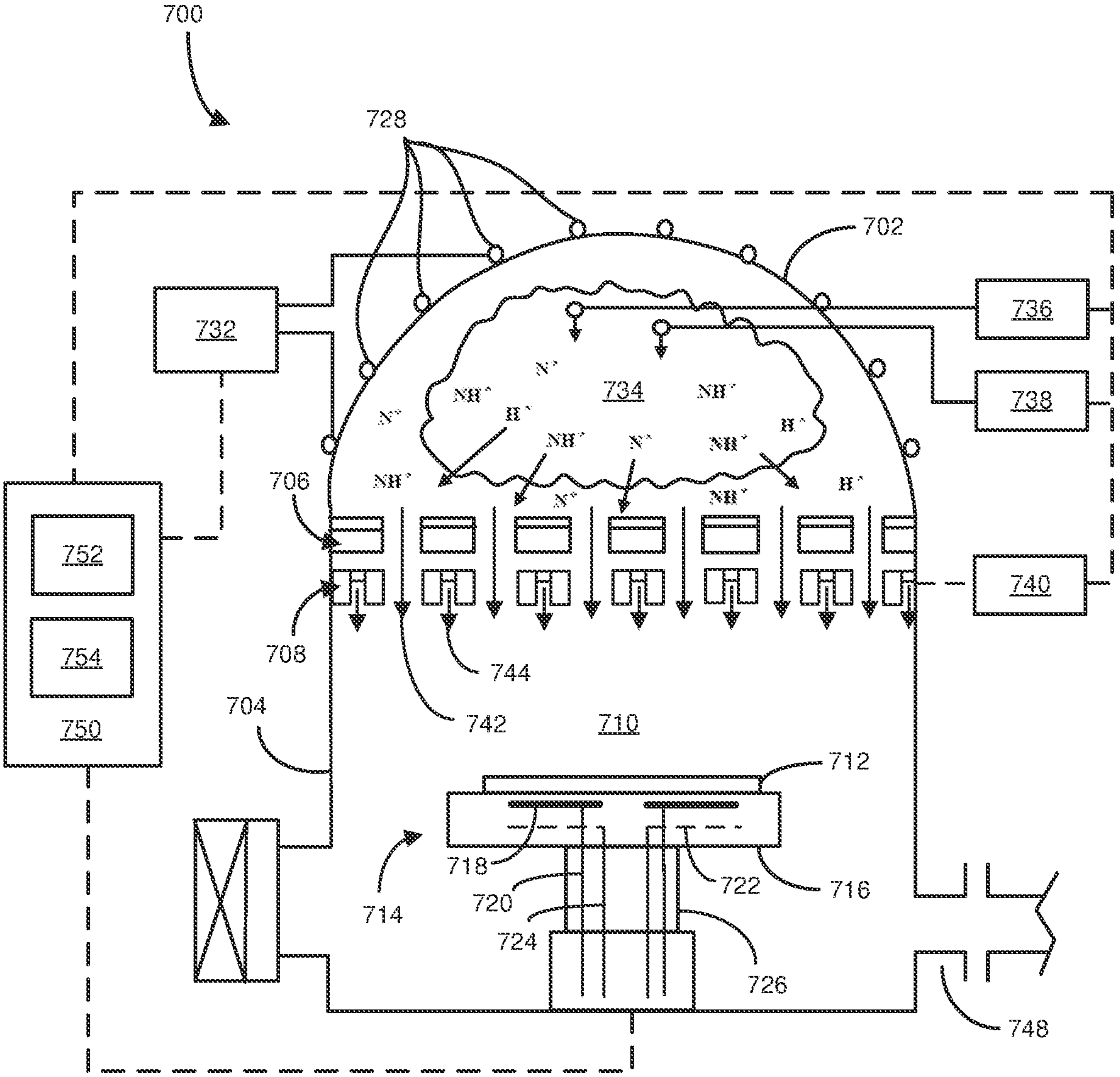
FIG. 7 shows a schematic illustration of an example plasma processing apparatus with a remote plasma source according to some implementations.

FIG. 7 shows a schematic illustration of an example plasma processing apparatus with a remote plasma source according to some implementations. The plasma processing apparatus 700 includes a remote plasma source 702 separated from a reaction chamber 704. The remote plasma source 702 is fluidly coupled with the reaction chamber 704 via a gas distributor or showerhead 706. In some embodiments, the showerhead 706 includes an ion filter for filtering ions to limit ion bombardment damage to a substrate 712. Radical species and/or ions are generated in the remote plasma source 702, where the radical species may be supplied to the reaction chamber 704. Precursors such as silicon-containing precursors are supplied to the reaction chamber 704 through gas outlets 708 positioned downstream from the remote plasma source 702 and from the showerhead 706. It will be understood, however, that other precursors may be supplied to the reaction chamber 704 through gas outlets 708 for depositing films such as oxides, nitrides, and oxynitrides. The precursors react with the radical species in a deposition zone 710 of the reaction chamber 704 to deposit film on a surface of the substrate 712. The deposition zone 710 includes an environment adjacent to the surface of the substrate 712.

The substrate 712 is supported on a substrate support structure or wafer pedestal 714. The wafer pedestal 714 may be configured with lift pins or other movable support members to position the substrate 712 within the deposition zone 710. The substrate 712 may be moved to a position closer or farther from the showerhead 706. The wafer pedestal 714 is shown in FIG. 7 as having elevated the substrate 712 within the deposition zone 710.

In some embodiments, the wafer pedestal 714 includes an electrostatic chuck 716. The electrostatic chuck 716 includes one or more electrostatic clamping electrodes 718 embedded within a body of the electrostatic chuck 716. In some implementations, the one or more electrostatic clamping electrodes 718 may be coplanar or substantially coplanar. The electrostatic clamping electrodes 718 may be powered by a DC power source or DC chucking voltage (e.g., between about 200 V to about 2000 V) so that the substrate 712 may be retained on the electrostatic chuck 716 by electrostatic attractive forces. Power to the electrostatic clamping electrodes 718 may be provided via first electrical lines 720. The electrostatic chuck 716 may further include one or more heating elements 722 embedded within the body of the electrostatic chuck 716. The one or more heating elements 722 may include resistive heaters. In some embodiments, the one or more heating elements 722 are positioned below the one or more electrostatic clamping electrodes 718. The one or more heating elements 722 may be configured to heat the substrate 712 to a temperature greater than about 450° C., greater than about 500° C., greater than about 550° C., greater than about 600° C., or greater than about 650° C. The one or more heating elements 722 provide selective temperature control to the substrate 712. Power to the one or more heating elements 722 may be provided via second electrical lines 724.

The wafer pedestal 714 includes the electrostatic chuck 716 and a stem 726 connected to an underside of the electrostatic chuck 716. The electrostatic chuck 716 may serve as a pedestal base or platen, and the stem 726 may serve as a support column. At least some portions of the stem 726 may be hollow so that the first electrical lines 720 and the second electrical lines 724 may be housed in the stem 726. In some cases, the stem 726 may facilitate passage of gases to a backside of the substrate 712.

A coil 728 is arranged around the remote plasma source 702, where the remote plasma source 702 includes an outer wall (e.g., quartz dome). The coil 728 is electrically coupled to a plasma generator controller 732, which may be used to form and sustain plasma within a plasma region 734 via inductively coupled plasma generation. In some implementations, the plasma generator controller 732 may include a power supply for supplying power to the coil 728, where the power can be in a range between about 500 W and about 15 KW per station, or between about 2 KW and about 10 KW per station during plasma generation. In some implementations, electrodes or antenna for parallel plate or capacitively coupled plasma generation may be used to generate a continuous supply of radicals via plasma excitation rather than inductively coupled plasma generation. Regardless of the mechanism used to ignite and sustain the plasma in the plasma region 734, radical species may continuously be generated using plasma excitation during film deposition. In some implementations, hydrogen radicals (H*), nitrogen radicals (N*), amine radicals (NH*, $NH_2$*), or combinations thereof, are generated in the plasma region 734 under approximately steady-state conditions during steady-state film deposition, though transients may occur at the beginning and end of film deposition. For example, nitrogen-containing radicals may be generated in the plasma region 734, where the nitrogen-containing radicals comprise at least one of nitrogen radicals (N*) and amine radicals (NH*, $NH_2$*).

A supply of ions and radicals may be continuously generated within the plasma region 734 while source gas is being supplied to the remote plasma source 702. Ions generated in the plasma region 734 may be filtered out by the ion filter of the showerhead 706. That way, radicals generated in the plasma region 734 may be supplied to the substrate 712 in the reaction chamber 704 while limiting ion bombardment. Conditions in the remote plasma source 702, including a composition of the source gas provided to the remote plasma source 702 and RF power supplied to the coil 728, may be controlled to optimize generation of desired radical species in the plasma region 734. In some embodiments, the source gas may include an oxygen-containing reactant such as oxygen or nitrogen-containing reactant such as nitrogen. In some embodiments, the source gas may include nitrogen gas and one or both of ammonia and hydrogen gas. By way of an example, nitrogen radicals, amine radicals, and hydrogen radicals may be generated in the plasma region 734, where a source gas mixture of nitrogen gas, ammonia, and hydrogen gas may be provided to the remote plasma source 702. In another example, nitrogen radicals may be generated along with one or both of amine and hydrogen radicals, where a source gas mixture of nitrogen gas and one or both of ammonia and hydrogen gas. A concentration of amine radicals may be greater or substantially greater than a concentration of hydrogen radicals for depositing silicon nitride film. A concentration of nitrogen radicals may be greater or substantially greater than a concentration of hydrogen radicals for depositing silicon nitride film.

In some embodiments, the source gas may be mixed with one or more additional gases. These one or more additional gases may be supplied to the remote plasma source 702. In some implementations, the source gas is mixed with one or more additional gases to form a gas mixture, where the one or more additional gases can include a carrier gas. Non-limiting examples of additional gases can include helium (He), neon (Ne), argon (Ar), krypton (Kr), and xenon (Xe). Other examples of additional gases can include hydrogen ($H_2$) and ammonia ($NH_3$). The one or more additional gases may support or stabilize steady-state plasma conditions within the remote plasma source 702 or aid in transient plasma ignition or extinction processes. In FIG. 7, a source gas supply 736 is fluidly coupled with the remote plasma source 702 for supplying the source gas. In addition, an additional gas supply 738 is fluidly coupled with the remote plasma source 702 for supplying the one or more additional gases. While the embodiment in FIG. 7 depicts the gas mixture of the source gas and the one or more additional gases being introduced through separate gas outlets, it will be understood that the gas mixture may be introduced directly into the remote plasma source 702. That is, a pre-mixed dilute gas mixture may be supplied to the remote plasma source 702 through a single gas outlet.

Plasma-activated gases 742, such as excited nitrogen, hydrogen, and/or amine radicals, flow out of the remote plasma source 702 and into the reaction chamber 704 via showerhead 706. Plasma-activated gases 742 within the showerhead 706 and within the reaction chamber 704 are generally not subject to continued plasma excitation therein. The showerhead 706 may have a plurality of gas ports to diffuse the flow of plasma-activated gases 742 into the reaction chamber 704. In some implementations, the plurality of gas ports may be mutually spaced apart. In some implementations, the plurality of gas ports may be arranged as an array of regularly spaced apart channels or through-holes extending through a plate separating the remote plasma source 702 and the reaction chamber 704. The plurality of gas ports may smoothly disperse and diffuse exiting radicals (including plasma-activated gases 742) from the remote plasma source 702 into the deposition zone 710 of the reaction chamber 704 while filtering out ions.

With the delivery of the plasma-activated gases 742 to the reaction chamber 704 from the showerhead 706, precursors 744 (or other process gases) may be introduced into the reaction chamber 704. The precursors 744 may include silicon-containing precursors such as DCS, HCDS, $SiCl_4$, $SiHCl_3$, or other silane. The precursors 744 may be introduced via gas outlets 708, where the gas outlets 708 may be fluidly coupled with a precursor supply source 740. The gas outlets 708 may include mutually spaced apart openings so that the flow of the precursors 744 may be introduced in a direction parallel with the plasma-activated gases 742 flowing from the showerhead 706. In some embodiments, the gas outlets 708 may be located downstream from the showerhead 706. In some embodiments, the gas outlets 708 are part of the showerhead 706 such as in a dual-plenum showerhead. The dual-plenum showerhead may provide separate outlets/passages for the plasma-activated species 742 and the precursors 744 to avoid mixing in the showerhead 706. That way, the precursors 744 may flow into the reaction chamber 704 via the showerhead 706 without exposure to plasma in the remote plasma source 702. The gas outlets 708 may be located upstream from the deposition zone 710 and the substrate 712. The chemical vapor deposition zone 710 is located within the interior of the reaction chamber 704 between the gas outlets 708 and the substrate 712.

A substantial fraction of the precursors 744 may be prevented from mixing with plasma-activated species 742 in the showerhead 706 or adjacent to the showerhead 706. In some implementations, precursors 744 may be delivered to the substrate 712 in dose phases of ALD cycles separate from plasma-activated species 742 delivered to the substrate 712 during plasma exposure phases of the ALD cycles. Adsorbed precursors 744 may react with radicals of the plasma-activated species 742 during plasma exposure phases of the ALD cycles to deposit film. In some implementations, precursors 744 may be delivered to the substrate 712 in a continuous manner to interact with plasma-activated species 742 in a deposition zone 710 to deposit film by CVD. The radicals of the plasma-activated species 742 mix with the precursors 744 in the gas phase during CVD formation of the film.

Gases may be removed from the reaction chamber 704 via an outlet 748 that is fluidly coupled to a pump (not shown). Thus, excess silicon-containing precursors, reactant gases, radical species, and diluent and displacement or purge gases may be removed from the reaction chamber 704.

In some embodiments, a thermal shield (not shown) may be positioned underneath the wafer pedestal 714. The thermal shield serves as a thermal insulator under the wafer pedestal 714 to mitigate heat loss via thermal radiation, thereby reducing the amount of power needed to maintain the wafer pedestal 714 at a particular elevated temperature and also preventing other components within the reaction chamber 704 from overheating due to excess heat radiated from the wafer pedestal 714. For example, the thermal shield may be radially offset from the stem 726 and may have a thin annular-shaped body with a high view factor relative to the underside of the electrostatic chuck 716. Thus, the annular-shaped thermal shield may reduce radiative heat loss from the wafer pedestal 714.

The electrostatic chuck 716 of the wafer pedestal 714 may chuck/dechuck the substrate 712 in the plasma processing apparatus 700 that is configured to operate at high temperatures, configured to deposit film such as silicon-containing film by remote plasma ALD, remote plasma CVD, or by thermal ALD, and configured to operate in corrosive environments. Such high temperatures may be greater than about 450° C., greater than about 500° C., greater than about 550° C., greater than about 600° C., or greater than about 650° C. Such corrosive environments may include exposure to halogenated silanes such as DCS and HCDS.

In some implementations, a system controller 750 is in operative communication with the plasma processing apparatus 700. In some implementations, the system controller 750 includes a processor system 752 (e.g., microprocessor) configured to execute instructions held in a data system 754 (e.g., memory). In some implementations, the system controller 750 may be in communication with the plasma generator controller 732 to control plasma parameters and/or conditions in the remote plasma source 702. In some implementations, the system controller 750 may be in communication with the wafer pedestal 714 to control pedestal elevation, electrostatic chucking and dechucking, and temperature. In some implementations, the system controller 750 may control other processing conditions, such as RF power settings, frequency settings, duty cycles, pulse times, pressure within the reaction chamber 704, pressure within the remote plasma source 702, gas flow rates from the source gas supply 736, gas flow rates from the additional gas supply 738, gas flow rates from the precursor supply source 740 and other sources, temperature of the wafer pedestal 714, and temperature of the reaction chamber 704, among other processing conditions.

The controller 750 may contain instructions for controlling process conditions for the operation of the plasma processing apparatus 700. The controller 750 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 750 or they may be provided over a network.

In certain embodiments, the controller 750 controls all or most activities of the plasma processing apparatus 700 described herein. For example, the controller 750 may control all or most activities of the plasma processing apparatus 700 associated with depositing a silicon-containing film and, optionally, other operations in a fabrication flow that includes the silicon-containing film. The controller 750 may execute system control software including sets of instructions for controlling the timing, gas composition, gas flow rates, chamber pressure, chamber temperature, RF power levels, substrate position, substrate temperature, DC chucking voltage, dechucking routines, and/or other parameters. Other computer programs, scripts, or routines stored on memory devices associated with the controller 750 may be employed in some embodiments. In a multi-station reactor, the controller 750 may comprise different or identical instructions for different apparatus stations, thus allowing the apparatus stations to operate either independently or synchronously.

In some embodiments, the controller 750 may include instructions configured to perform operations such as introducing a first dose of a silicon-containing precursor 744 in a vapor phase to adsorb on the substrate 712, and exposing the substrate 712 to plasma-activated species 742 of a source gas generated in the remote plasma source 702, where the adsorbed silicon-containing precursor 744 reacts with the plasma-activated species 742 to deposit a silicon-containing film. In some embodiments, the controller 750 may include instructions configured to perform operations such as setting the chamber pressure in the reaction chamber 704 to between about 1 Torr and about 30 Torr, and setting a substrate temperature to an elevated temperature between about 500° C. and about 700° C. In some embodiments, the controller 750 may include instructions configured to perform operations such as applying a first voltage to the electrostatic chuck 716 of the wafer pedestal 714 for electrostatically clamping the substrate 712 in the reaction chamber 704, reversing a polarity of the first voltage applied to the electrostatic chuck 716, applying a second voltage to the electrostatic chuck 716 that is less than the first voltage, reversing a polarity of the second voltage applied to the electrostatic chuck 716, and removing the substrate 712 from the electrostatic chuck 716.

In some embodiments, the apparatus 700 may include a user interface associated with controller 750. The user interface may include a display screen, graphical software displays of the apparatus 700 and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon nitride), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Figure 8:
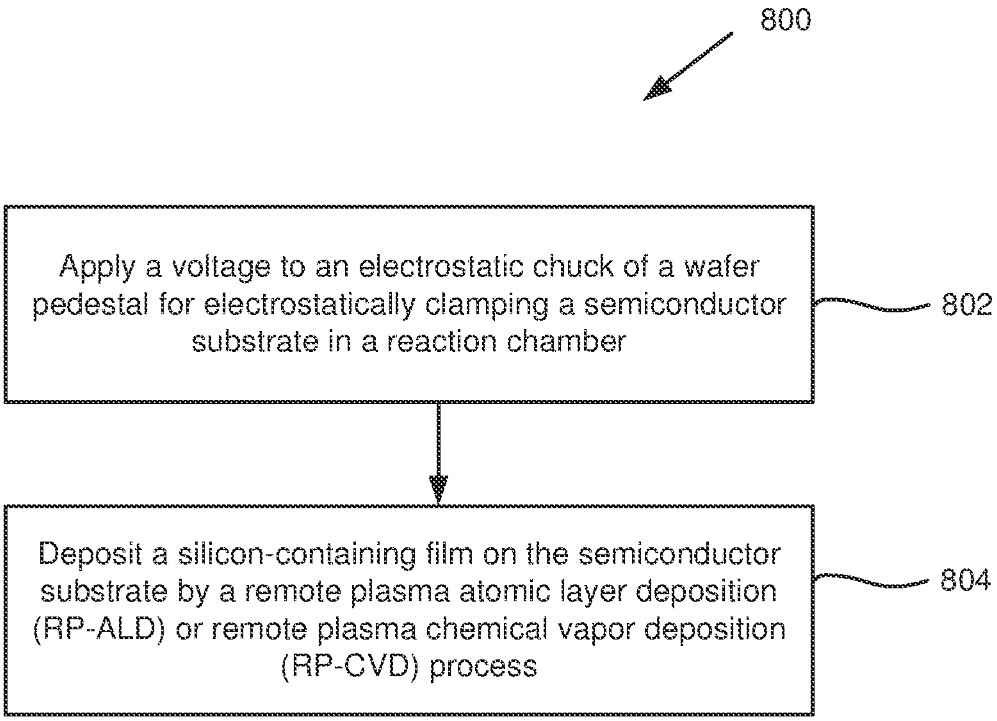
FIG. 8 shows a flow diagram illustrating an example method of using a remote plasma processing apparatus to deposit a silicon-containing film on a semiconductor substrate retained on an electrostatic chuck according to some implementations.

FIG. 8 shows a flow diagram illustrating an example method of using a remote plasma processing apparatus to deposit a silicon-containing film on a semiconductor substrate retained on an electrostatic chuck according to some implementations. The operations of a process 800 may be performed in different orders and/or with different, fewer, or additional operations. One or more operations of the process 800 may be performed using a plasma processing apparatus described in any one of FIGS. 4 and 7. In some implementations, the operations of the process 800 may be implemented, at least in part, according to software stored in one or more non-transitory computer readable media.

At block 802 of the process 800, a voltage is applied to an electrostatic chuck of a wafer pedestal for electrostatically clamping a semiconductor substrate in a reaction chamber. The semiconductor substrate may be a silicon wafer, such as a 200-mm, 300-mm, or 450-mm wafer, including wafers having one or more layers of material, such as dielectric, conducting, or semiconducting materials deposited on a front side of the substrate. Some of the layers may be patterned. In some implementations, the semiconductor substrate includes a patterned 3D-NAND structure and one or more etched trenches in the substrate. The patterned 3D-NAND structure may include several layers of materials, such as 32 or more layers, 64 or more layers, or 96 or more layers. To overcome the effects of bowing, the semiconductor substrate may be chucked by the electrostatic chuck to the wafer pedestal.

In some implementations, the semiconductor substrate is placed on a top surface of the electrostatic chuck. The electrostatic chuck may include a top plate made of a ceramic material and one or more electrostatic clamping electrodes embedded in the top plate. The one or more electrostatic clamping electrodes may be configured to receive the voltage applied to the electrostatic chuck to electrostatically adhere the semiconductor substrate to the electrostatic chuck. In some embodiments, the voltage may be anywhere between about 200 V and about 2000 V. The electrostatic chuck may further include heating elements embedded in the top plate of the electrostatic chuck for controlling a temperature of the semiconductor substrate. In some embodiments, the heating elements may heat the semiconductor substrate to an elevated temperature between about 300° C. and about 750° C. or between about 500° C. and about 700° C. The electrostatic chuck may be configured to withstand high operating temperatures. In some embodiments, the electrostatic chuck may include MCAs and an upper annular seal surface to vertically offset the semiconductor substrate from a recess of the top plate. The upper annular seal surface may support the semiconductor substrate at the edge of the semiconductor substrate. The upper annular seal surface may also be referred to as a seal band or circumferential ring. When the semiconductor substrate is electrostatically clamped, small gaps between the substrate edge and the upper annular seal surface are prevented in order to inhibit gas flow to the underside of the substrate and limit deposition at the underside of the substrate.

The reaction chamber may be part of a plasma processing apparatus for exposing the semiconductor substrate to remote plasma. The reaction chamber and the wafer pedestal in the reaction chamber may be located downstream from a remote plasma source. The remote plasma source may be configured to generate plasma of a source gas. Ions may be filtered out by an ion filter positioned between the remote plasma source and the reaction chamber so that the semiconductor substrate is primarily exposed to radicals. In some embodiments, the plasma processing apparatus may expose the semiconductor substrate to remote plasma to perform deposition such as ALD or CVD. The electrostatic chuck may be employed for electrostatically chucking the semiconductor substrate while exposing the semiconductor substrate to remote plasma for depositing films by ALD or CVD.

At block 804 of the process 800, a silicon-containing film is deposited on the semiconductor substrate by remote plasma atomic layer deposition (RP-ALD) or remote plasma chemical vapor deposition (RP-CVD) process. Such vapor deposition processes may occur in the reaction chamber while the semiconductor substrate is electrostatically clamped by the electrostatic chuck in the reaction chamber. In some embodiments, the silicon-containing film is silicon oxide. In some embodiments, the silicon-containing film is silicon nitride. In some embodiments, the silicon-containing film is silicon carbide. It will be understood that other films may be deposited on the semiconductor substrate such as oxides, nitrides, or oxynitrides.

During remote plasma exposure, the semiconductor substrate may be exposed to elevated temperatures and high pressures. Generally speaking, RP-ALD processes and RP-CVD processes do not utilize elevated temperatures and high pressures to deposit film. In some cases, elevated temperatures can decompose precursors and high pressures can lead to arcing. Elevated temperatures can usually damage an underlying semiconductor device structure in the semiconductor substrate. Elevated temperatures may also be difficult to manage from a mechanical perspective. Elevated pressures may make it difficult to ignite plasma within a remote plasma source. Moreover, elevated pressures can lead to stoichiometric detonation of fuel or oxidizer mixtures such as $H_2/O_2$. However, RP-ALD or RP-CVD processes may be performed with an electrostatic chuck in the reaction chamber with relatively high temperatures and high pressures. In some implementations, a chamber pressure in the reaction chamber may be between about 1 Torr and about 30

Torr. In some implementations, a substrate temperature may be between about 500° C. and about 700° C.

Generation of the plasma in the remote plasma source may be obtained by applying high RF power. In some implementations, an RF power applied to the remote plasma source can be between about 500 W and about 15 KW per station, between about 2 kW and about 10 kW per station, or between about 3 kW and about 8 KW per station, such as about 6.5 kW per station.

In some implementations, depositing the silicon-containing film can occur by ALD. This can include introducing a dose of a precursor in a vapor phase to adsorb on the surface of the semiconductor substrate. For example, the precursor can include a silicon-containing precursor. Examples of silicon-containing precursors include but are not limited to silanes such as DCS, HCDS, tetrachlorosilane, and trichlorosilane. The electrostatic chuck may be configured to withstand a corrosive environment including exposure to halogenated silanes. Deposition by ALD can further include introducing a plasma-activated species of a reactant in a vapor phase to the semiconductor substrate, where the plasma-activated species is a remote plasma generated in the remote plasma source. For example, the reactant can include an oxygen-containing reactant or nitrogen-containing reactant. Example reactants include but are not limited to oxygen, ozone, carbon dioxide, carbon monoxide, nitrous oxide, water, methanol, hydrazine, nitrogen, ammonia, hydrogen, and the like. In some cases, the reactant can include a combination of gases such as a combination of nitrogen, ammonia, and hydrogen. The semiconductor substrate is exposed to the remote plasma to convert the adsorbed precursor to a monolayer of the silicon-containing film. Multiple ALD cycles may be performed to achieve a desired thickness of the silicon-containing film.

The semiconductor substrate is electrostatically clamped on the electrostatic chuck during multiple ALD cycles. Though gases are cycled consistently and frequently, with gases and pressures changing throughout processing, the semiconductor substrate remains electrostatically clamped. Gases are unable to penetrate to a backside of the semiconductor substrate even around the edges of the semiconductor substrate.

The semiconductor substrate may be dechucked from the electrostatic chuck by a dechucking routine. After deposition of the silicon-containing film, the semiconductor substrate may be removed by performing the dechucking routine without assistance from plasma exposure. This dechucking routine is described below with reference to FIGS. 9 and 10.

Figure 9:
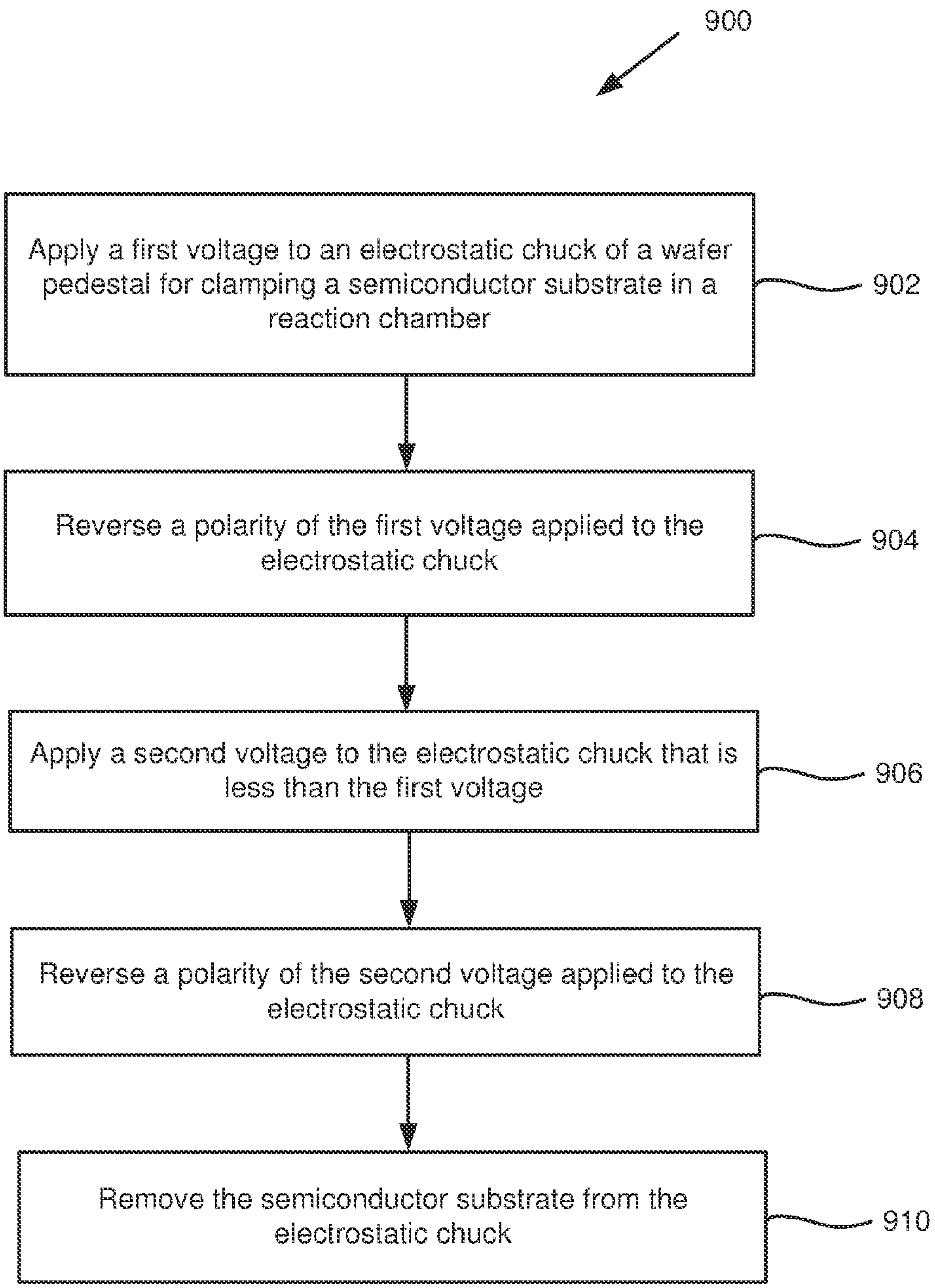
FIG. 9 shows a flow diagram illustrating an example method of dechucking a semiconductor substrate from an electrostatic chuck according to some implementations.
Figure 10:
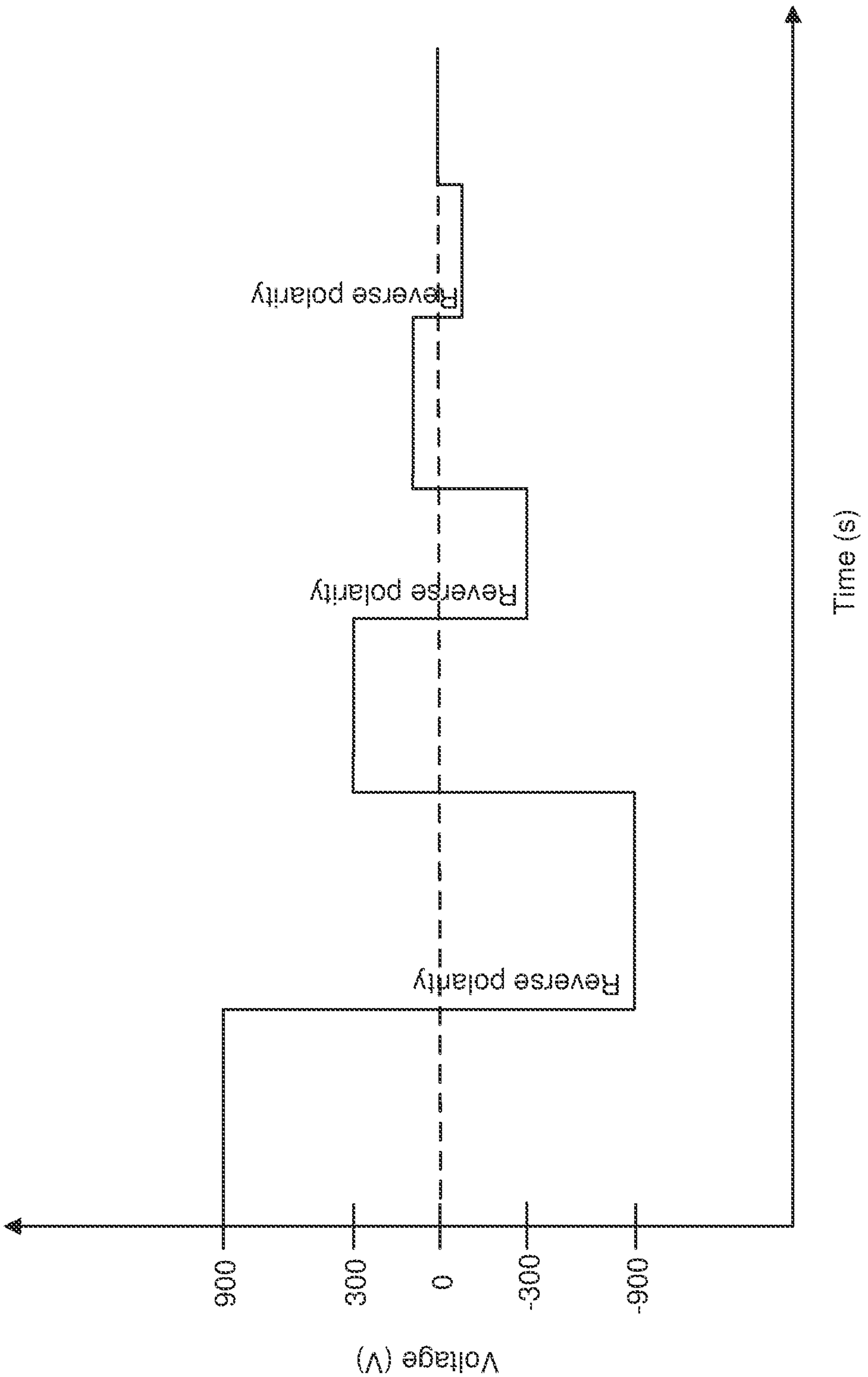
FIG. 10 shows an example timing sequence diagram of a declamping routine for dechucking a semiconductor substrate from an electrostatic chuck (e.g., bipolar chuck) according to some implementations.

FIG. 9 shows a flow diagram illustrating an example method of dechucking a semiconductor substrate from an electrostatic chuck according to some implementations. The operations of a process 900 may be performed in different orders and/or with different, fewer, or additional operations. The operations of the process 900 may be described with reference to the timing sequence diagram of FIG. 10. FIG. 10 shows an example timing sequence diagram of a declamping routine for dechucking a semiconductor substrate from an electrostatic chuck (e.g., bipolar chuck) according to some implementations. The timing sequence diagram shows a waveform representing only half of the phases of a bipolar chuck, whereas the other half is not shown but would be understood to represent an inverse polarity phase. Similarly, the operations of the process 900 are described with reference to one half of the phases of a bipolar chuck and it will be understood that the other half would be represented by an inverse polarity phase. In some implementations, the operations of the process 900 may be implemented, at least in part, according to software stored in one or more non-transitory computer readable media. In some implementations, the operations of the process 900 are performed in a remote plasma apparatus.

At block 902 of the process 900, a first voltage is applied to an electrostatic chuck of a wafer pedestal for clamping a semiconductor substrate in a reaction chamber. The reaction chamber may be part of a remote plasma apparatus as described above for depositing film by ALD. Aspects of clamping the semiconductor substrate to the electrostatic chuck are described above. In some embodiments, the first voltage may be received by clamping electrodes embedded in a ceramic body of the electrostatic chuck. In some embodiments, the first voltage may be anywhere between about +200 V and about +2000V, such as about +900V. The first voltage may also be referred to as a holding voltage or clamping voltage.

At block 904 of the process 900, a polarity of the first voltage applied to the electrostatic chuck is reversed. Thus, an opposite voltage (e.g., negative voltage) is applied to the electrostatic chuck, where the opposite voltage is the same magnitude as the first voltage for chucking the semiconductor substrate. The opposite voltage may be anywhere between about −200V and about −2000V. The polarity switch from the first voltage to the opposite voltage may occur instantaneously. Application of the opposite voltage may occur after completion of a deposition process by ALD. Accordingly, the semiconductor substrate may undergo declamping after deposition of a film is complete. In some implementations, the opposite voltage may be held for a duration between about 1 second and about 10 seconds, or at least about 2 seconds, such as about 3 seconds.

In some implementations, the process 900 includes exposing the semiconductor substrate to a transfer in the reaction chamber prior to reversing the polarity of the first voltage. Transfer may include one or more steps. In some cases, transfer may involve dropping the semiconductor substrate onto lift pins and then lowering the semiconductor substrate onto the wafer pedestal, or vice versa, for substrate removal. In dropping the semiconductor substrate, a transfer pressure may be applied. The transfer pressure is less than a chamber pressure applied to the semiconductor substrate after undergoing deposition by ALD. For instance, the transfer pressure may be between about 0.05 Torr and about 1 Torr, or equal to or less than about 0.5 Torr, or equal to or less than about 0.05 Torr. In some embodiments, chamber pressure may be ramped down to the desired transfer pressure over X seconds, where X is a time period between about 0.5 seconds and about 30 seconds, or between about 1 second and about 10 seconds. After dropping the semiconductor substrate, the reaction chamber may be pumped down in pressure even further before clamping.

At block 906 of the process 900, a second voltage is applied to the electrostatic chuck that is less than the first voltage. A polarity switch occurs from the opposite voltage (at block 904) to the second voltage so that the polarity of the second voltage is the same as the first voltage. The polarity switch may occur instantaneously. In some implementations, the second voltage is one-third in magnitude of the first voltage. To illustrate, if the first voltage is +900V, then the second voltage is about +300V. In some cases, application of the second voltage may occur after a polarity switch from the opposite voltage (at block 904) to the first voltage, and the first voltage is gradually ramped down to the second voltage. In some implementations, the second voltage may be held for a duration between about 1 second and about 10 seconds, or at least about 2 seconds, such as about 3 seconds.

At block 908 of the process 900, a polarity of the second voltage applied to the electrostatic chuck is reversed. Hence, an opposite voltage (e.g., negative voltage) of the second voltage is applied to the electrostatic chuck, where the opposite voltage is the same magnitude as the second voltage. The polarity switch from the second voltage to the opposite voltage of the second voltage may occur instantaneously. In some implementations, the opposite voltage of the second voltage may be held for a duration between about 1 second and about 10 seconds, or at least about 2 seconds, such as about 3 seconds.

In some implementations, the process 900 may further include applying a third voltage to the electrostatic chuck that is less than the second voltage. A polarity switch may occur from the opposite voltage (at block 908) to the third voltage so that the polarity of the third voltage is the same as the second voltage. The polarity switch may occur instantaneously. In some implementations, the third voltage is one-third in magnitude of the second voltage. To illustrate, if the second voltage is +300V, then the third voltage is about +100V. In some implementations, the third voltage may be held for a duration between about 1 second and about 10 seconds, or at least about 2 seconds, such as about 3 seconds.

In some implementations, the process 900 may further include ramping or otherwise reducing the voltage applied to the electrostatic chuck to zero (0V). This may occur gradually or instantaneously. This effectively turns off clamping on the electrostatic chuck. In some implementations, additional cycles of polarity switches and reduced voltages may be repeated prior to switching off the clamping on the electrostatic chuck. In other words, the electrostatic chuck may apply a fourth voltage (less than the third voltage), a polarity switch, a fifth voltage (less than a fourth voltage), a polarity switch, and so forth before reducing the voltage to zero.

At block 910 of the process 900, the semiconductor substrate is removed from the electrostatic chuck. Rather than removing an electrostatically clamped semiconductor substrate immediately after undergoing a vapor deposition process in a remote plasma processing apparatus, the semiconductor substrate is subjected to the foregoing declamping routine. Because stuck charges may persist on the semiconductor substrate, resulting in residual sticking forces on the semiconductor substrate even after the clamping voltage is turned off, the declamping routine of the present disclosure can promote wafer discharging and minimize residual sticking forces. That way, the semiconductor substrate can be removed from the electrostatic chuck without wafer popping, particle generation, or wafer breakage.

FIG. 10 shows an example timing sequence diagram of a declamping routine for dechucking a semiconductor substrate from an electrostatic chuck (e.g., bipolar chuck) according to some implementations. The waveform of a bipolar chuck in FIG. 10 represents only one half of the phases and the other half (inverse polarity phase) is not shown. As illustrated in FIG. 10, a clamping voltage is applied to electrostatically clamp a semiconductor substrate during processing. The clamping voltage starts at +900V in the example timing sequence diagram. Processing the semiconductor substrate may involve exposing the semiconductor substrate to remote plasma to deposit film such as silicon-containing film. In some cases, the semiconductor substrate may be exposed to elevated temperatures and high pressures during processing. Due to the likelihood of stuck charges on the semiconductor substrate after processing, the semiconductor substrate on the electrostatic chuck may undergo a declamping routine. To initiate declamping in the declamping routine, polarity is reversed from the clamping voltage. Thus, a voltage of −900V is applied to the electrostatic chuck and held for a few seconds (e.g., about 3 seconds). Afterwards, polarity is reversed to a reduced holding voltage that is less than the original clamping voltage. The reduced holding voltage may be +300V, which is about one-third of the original clamping voltage. The reduced holding voltage may be held for a few seconds (e.g., about 3 seconds). From there, polarity is reversed from the reduced holding voltage. As such, a voltage of −300V is applied to the electrostatic chuck and held for a few seconds (e.g., about 3 seconds). Then polarity is reversed again to a more reduced holding voltage that is less than the reduced holding voltage. The more reduced holding voltage may be +100V, which is about one-ninth of the original clamping voltage. The more reduced voltage may be held for a few seconds (e.g., about 3 seconds) After that, polarity is reduced from the more reduced holding voltage. Accordingly, a voltage of −100V is applied to the electrostatic chuck and held for a few seconds (e.g., about 3 seconds). The electrostatic chuck may be turned off. Alternatively, multiple steps of reversing polarity and reducing the holding voltage may be repeated before turning off clamping in the electrostatic chuck. In some implementations, the electrostatic chuck may be turned off for several seconds (e.g., about 10 seconds) before removing the semiconductor substrate. After undergoing the aforementioned steps in the declamping routine, the semiconductor substrate may be removed.

Conformal silicon nitride film may be deposited by remote plasma ALD in the present disclosure. Conformal silicon nitride film may be deposited in high aspect ratio features having uniform film properties within the high aspect ratio features. To obtain high step coverage and uniformity of film properties in high aspect ratio features, various deposition conditions and parameters are controlled. Such controllable deposition conditions may include but are not limited to gas mixture composition, flow rate ratios, pressure, RF power, and temperature. The conformal silicon nitride film may be deposited by ALD by controlling flow rates of nitrogen, ammonia, and hydrogen gas used in remote plasma generation. This can control an amount of amine radicals ($NH^*$ or $NH_2^*$), hydrogen radicals ($H^*$), and nitrogen radicals ($N^*$) generated in a remote plasma source. In some embodiments, a concentration of amine radicals is substantially greater than an amount of hydrogen radicals in the remote plasma. Along with a suitable pressure, temperature, RF power, and other deposition conditions, the silicon nitride film may be deposited on a semiconductor substrate with improved film properties.

Figure 11:
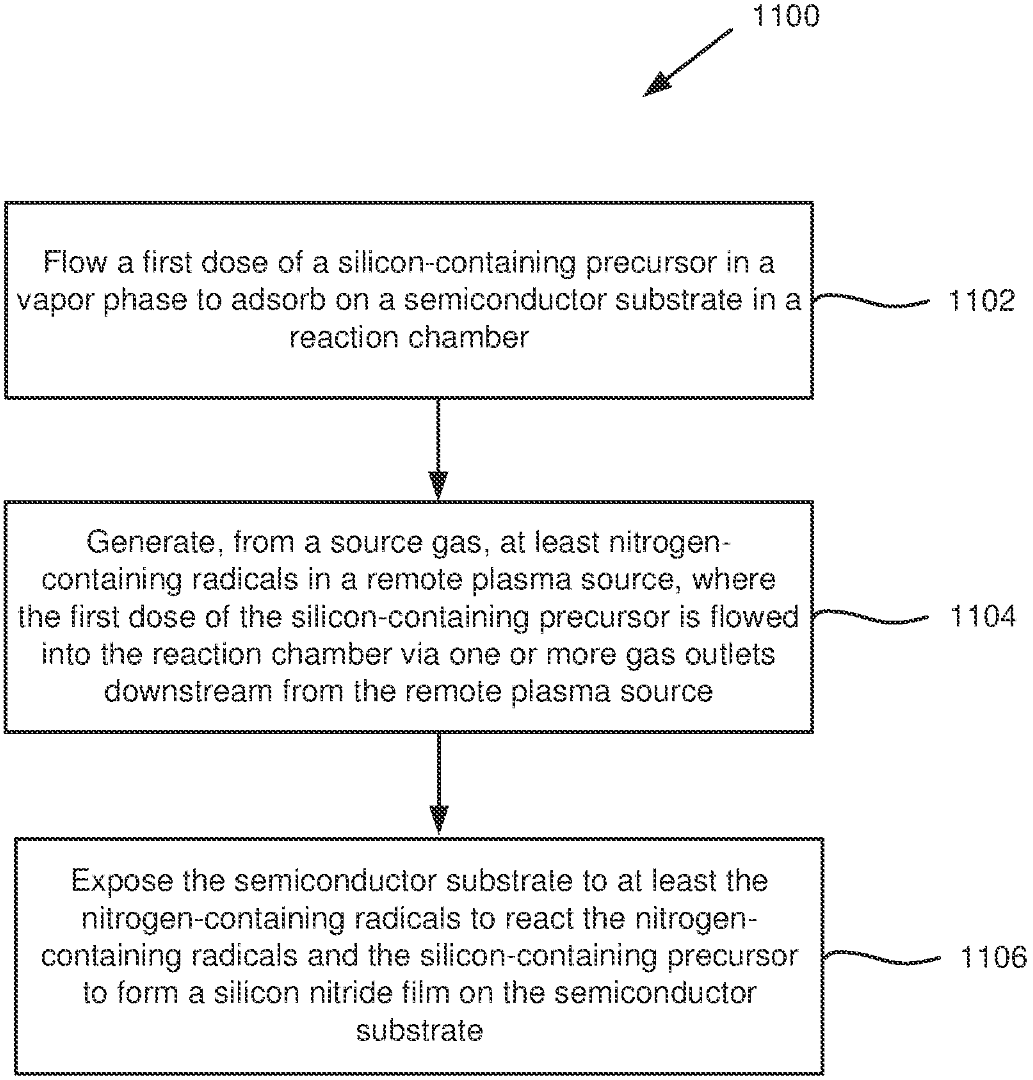
FIG. 11 shows a flow diagram of an example method of depositing a silicon nitride film on a semiconductor substrate by remote plasma ALD according to some implementations.

FIG. 11 shows a flow diagram of an example method of depositing a silicon nitride film on a semiconductor substrate by remote plasma ALD according to some implementations. The operations of a process 1100 may be performed in different orders and/or with different, fewer, or additional operations. Aspects of the process 1100 may be described with reference to FIGS. 12A and 12B. In some implementations, the operations of the process 1100 may be implemented, at least in part, according to software stored in one or more non-transitory computer readable media.

At block 1102 of the process 1100, a first dose of a silicon-containing precursor in a vapor phase is flowed to adsorb on a semiconductor substrate in a reaction chamber. The semiconductor substrate may be a silicon substrate, such as a 200-mm, 300-mm, or 450-mm substrate, including substrates having one or more layers of material. The one or more layers of materials may be part of a memory structure such as a 3D-NAND structure. In some implementations, the semiconductor substrate may have a plurality of features, which may refer to non-planar structures of the semiconductor substrate. Examples of features include trenches, contact holes, recesses, pillars, domes, and the like. A feature such as a recessed feature typically has an aspect ratio (depth to lateral dimension). In some implementations, the plurality of features may be a plurality of high aspect ratio features having an aspect ratio of at least about 10:1, at least about 15.1, at least about 20:1, at least about 30:1, at least about 50:1, or at least about 100:1. In some implementations, the semiconductor substrate is supported and retained on an electrostatic chuck in the reaction chamber during exposure to the silicon-containing precursor.

In some implementations, the silicon-containing precursor includes a silane, such as an aminosilane. In some implementations, the silicon-containing precursor includes a halosilane such as DCS, HCDS, $SiCl_4$, or $SiHCl_3$. The semiconductor substrate may be exposed to the silicon-containing precursor while the semiconductor substrate is heated to an elevated temperature. The elevated temperature may be between about 300° C. and about 750° C. or between about 500° C. and about 700° C. The aminosilane or halosilane may be able to withstand such high temperatures without decomposing. In addition, the semiconductor substrate may be exposed to a high chamber pressure. The pressure in the reaction chamber, and the remote plasma source for that matter, may be controlled to be between about 0.5 Torr and about 40 Torr, between about 1 Torr and about 30 Torr, or between about 2 Torr and about 20 Torr.

The semiconductor substrate may be exposed to the first dose of the silicon-containing precursor during a dose phase of an ALD cycle. A duration of the dose phase may be between about 0.1 seconds and about 100 seconds, between about 0.2 seconds and about 50 seconds, or between about 0.3 seconds and about 10 seconds, depending on the flow rate and substrate surface area. During the dose phase, plasma is turned off, no plasma-activated species are flowed towards the semiconductor substrate, and a carrier gas may be optionally flowed towards the semiconductor substrate.

At block 1104 of the process 1100, at least nitrogen-containing radicals are generated in a remote plasma source from a source gas, where the first dose of the silicon-containing precursor is flowed into the reaction chamber via one or more gas outlets downstream from the remote plasma source. The remote plasma source may be positioned upstream of the reaction chamber and the electrostatic chuck. The remote plasma source may be fluidly coupled to the reaction chamber via a showerhead. The showerhead may include an ion filter for filtering out ions from plasma-activated species being flowed towards the semiconductor substrate so that a substantial fraction of the plasma-activated species includes radical species. The nitrogen-containing radicals generated in the remote plasma source are delivered to the reaction chamber through the showerhead. The silicon-containing precursor is flowed to the reaction chamber through the one or more gas outlets in a separate flow path from the nitrogen-containing radicals to avoid mixing. The one or more gas outlets may be located separately and downstream from the showerhead in some implementations. Or, the silicon-containing precursor is flowed through the showerhead in separate openings from the nitrogen-containing radicals, where the one or more gas outlets are part of the showerhead.

Generating at least nitrogen-containing radicals from the source gas includes generating amine radicals in the remote plasma source. In some cases, generating at least nitrogen-containing radicals from the source gas further includes generating hydrogen radicals and/or generating nitrogen radicals. A concentration of amine radicals generated in the remote plasma source may be substantially greater than a concentration of the hydrogen radicals. In some implementations, a concentration of nitrogen radicals generated in the remote plasma source may be substantially greater than a concentration of the hydrogen radicals. As used herein, the term "substantially greater" with respect to a concentration of the amine radicals or nitrogen radicals can refer to a concentration that is at least two times greater than a concentration of the hydrogen radicals. Process conditions in the remote plasma source may be specified to control the concentration of amine radicals relative to hydrogen radicals and/or nitrogen radicals. Properties of the silicon nitride film can be optimized by controlling the relative amounts of amine radicals, hydrogen radicals, and nitrogen radicals generated in the remote plasma source.

A source gas is supplied to the remote plasma source. In some embodiments, the source gas is provided in a carrier gas such as helium. Nitrogen-containing radicals and other radical species in the remote plasma may be produced from a source gas that includes hydrogen, ammonia, nitrogen, or mixtures thereof. In some cases, the source gas includes a mixture of hydrogen, ammonia, and nitrogen. In some cases, the source gas includes a mixture of nitrogen and ammonia. In some cases, the source gas includes a mixture of ammonia and hydrogen. In some implementations, a flow rate of the nitrogen is between about 5000 sccm and about 40000 sccm, a flow rate of ammonia is between about 0 sccm and about 5000 sccm, and a flow rate of the hydrogen is between about 0 sccm and about 5000 sccm. Flow rates of the gas(es) in the source gas can influence the relative concentrations of amine radicals, nitrogen radicals, and hydrogen radicals. Specifically, a flow rate ratio of nitrogen to hydrogen, a flow rate ratio of ammonia to hydrogen, or a flow rate ratio of nitrogen to ammonia can be modified or otherwise tuned to generate the desired relative concentrations of amine radicals, nitrogen radicals, and hydrogen radicals. Generating at least nitrogen-containing radicals from the source gas can include causing chemical species of the source gas to dissociate and generate ions and radicals of the source gas.

In some implementations, an RF power can be modified or otherwise tuned to influence generation of nitrogen-containing radicals (e.g., amine radicals and nitrogen radicals) and other radicals (e.g., hydrogen radicals). In some cases, the RF power supplied to an RF power source coupled to the remote plasma source is between about 500 W and about 15 kW, or between about 2 kW and about 10 KW, such as about 6.5 kW. Higher RF power can lead to a higher density of nitrogen-containing radicals as well as higher energy nitrogen-containing radicals.

At block 1106 of the process 1100, the semiconductor substrate is exposed to at least the nitrogen-containing radicals to react the nitrogen-containing radicals and the silicon-containing precursor to form a silicon nitride film on the semiconductor substrate. In particular, the semiconductor substrate is exposed to remote plasma generated from the remote plasma source. The remote plasma includes plasma-activated species (e.g., the nitrogen-containing radicals) of the source gas that react with the adsorbed silicon-containing precursor to form silicon nitride. In some implementations, a purge operation may be performed between the dose step at block 1102 and the plasma exposure step at block 1106.

Process conditions in the reaction chamber may be controlled for optimized deposition of the silicon nitride film. In some implementations, the semiconductor substrate may be maintained at an elevated temperature, where the elevated temperature is between about 300° C. and about 750° C. or between about 500° C. and about 700° C. Higher temperatures may promote higher quality silicon nitride film and improved growth of the silicon nitride film. In some implementations, a chamber pressure in the reaction chamber may be maintained at a high pressure, where the chamber pressure is between about 0.5 Torr and about 40 Torr, between about 1 Torr and about 30 Torr, or between about 2 Torr and about 20 Torr. Higher pressures may promote a higher density of nitrogen-containing radicals reaching the semiconductor substrate.

Exposure to the remote plasma occurs during a plasma exposure phase of the ALD cycle. A duration of the plasma exposure phase may be between about 0.5 seconds and about 200 seconds, between about 1 second and about 120 seconds, or between about 2 seconds and about 80 seconds. During the plasma exposure phase, plasma is turned on, no silicon-containing precursor is flowed towards the semiconductor substrate, and a carrier gas may be optionally flowed towards the semiconductor substrate. In some implementations, a purge operation may be performed after the plasma exposure step at block 1106.

The silicon nitride film may be conformally deposited by ALD under conditions that optimize step coverage and uniformity of film properties in the semiconductor substrate, where the silicon nitride film may be deposited in high aspect ratio features of the semiconductor substrate. In some implementations, a step coverage of the silicon nitride film is at least about 85%, at least about 90%, at least about 95%, at least about 98%, or at least about 99%. In some implementations, a wet etch rate of the silicon nitride film is between about 1.4 Å/min and about 10.0 Å/min. In some implementations, a film density of the silicon nitride film is between about 2.6 $g/cm^3$ and about 3.0 $g/cm^3$. In some implementations, an intrinsic stress in the silicon nitride film is between about −300 MPa and about −1000 MPa. The film properties of the silicon nitride film, including any of the aforementioned film properties of step coverage, wet etch rate, film density, and intrinsic stress, is substantially uniform along the sidewalls of the high aspect ratio features of the semiconductor substrate. As used herein, the term "substantially uniform" with respect to film properties along sidewalls of high aspect ratio features can refer to values that do not deviate by more than 50% of a stated value. It will be understood that other film properties (e.g., refractive index) of the silicon nitride film may be tuned by the ALD process conditions and substantially uniform along the sidewalls of the high aspect ratio features.

Figure 12A:
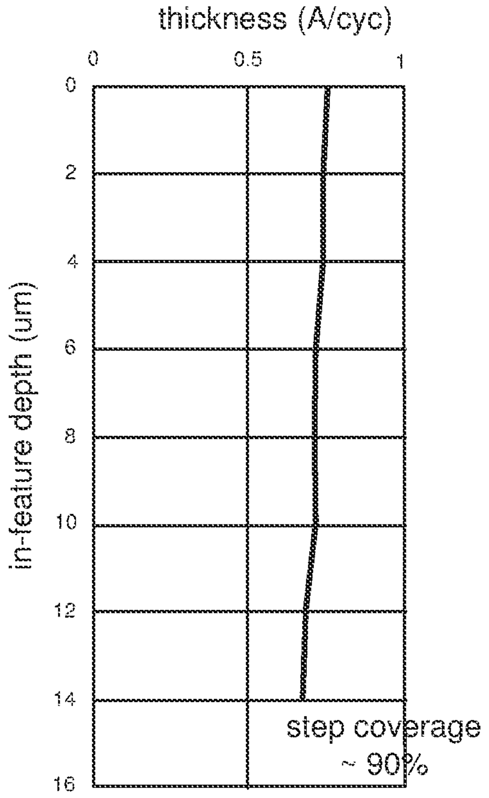
FIG. 12A shows a graph illustrating step coverage of a silicon nitride film deposited in a recessed feature by remote plasma ALD.

FIG. 12A shows a graph illustrating step coverage of a silicon nitride film deposited in a recessed feature by remote plasma ALD. The recessed feature of a semiconductor substrate is about 180:1. Silicon nitride is deposited by remote plasma ALD in the recessed feature under conditions as described in the present disclosure. As shown in FIG. 12A, silicon nitride film has a step coverage of about 90% along the sidewalls of the recessed feature. The step coverage remains largely the same at varying depths.

Figure 12B:
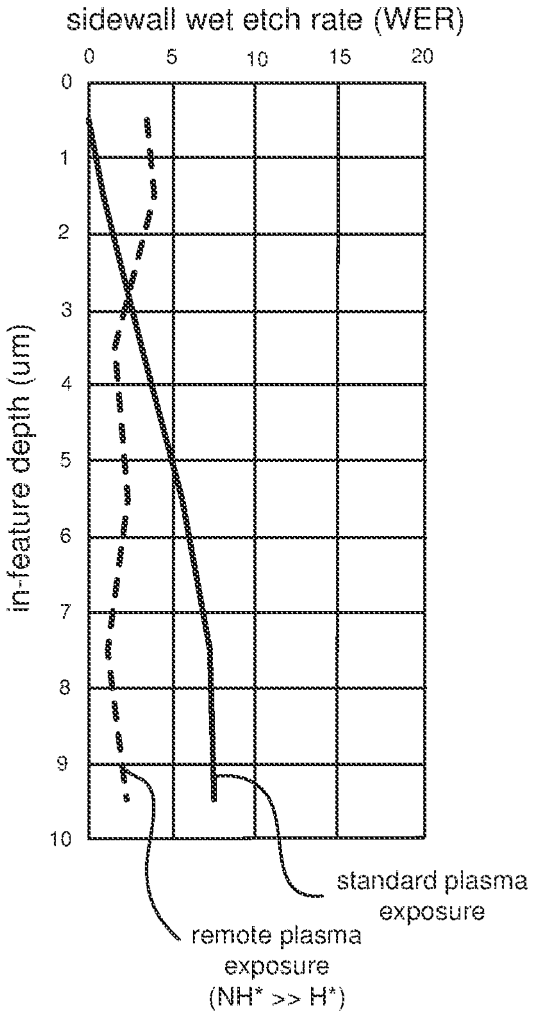
FIG. 12B shows a graph illustrating sidewall wet etch rate of a silicon nitride film deposited in a recessed feature by remote plasma ALD.

FIG. 12B shows a graph illustrating sidewall wet etch rate of a silicon nitride film deposited in a recessed feature by remote plasma ALD. The recessed feature of a semiconductor substrate is about 180:1. In one process, silicon nitride is deposited by a standard PEALD process that exposes the semiconductor substrate to a capacitively coupled plasma generated in situ rather than remotely. In another process, silicon nitride is deposited by remote plasma ALD in the recessed feature under conditions as described in the present disclosure. As shown in FIG. 12B, the sidewall wet etch rate of the silicon nitride deposited by the standard PEALD process varies significantly at greater depths. However, the sidewall wet etch rate of the silicon nitride deposited by the remote plasma ALD process remains largely the same at varying depths.

Silicon nitride is deposited conformally in a tool that utilizes an electrostatic chuck in a remote plasma ALD environment. Rather than generating plasma directly above the semiconductor substrate, remote plasma is generated in a remote plasma source that uses an ion filter to filter out ions so that ion bombardment is minimized. Furthermore, precursor gas is delivered to the semiconductor substrate without flowing through the remote plasma source. Precursor gas may be delivered out of a showerhead via separate holes from which the remote plasma travels through, or out of gas ports positioned downstream from the showerhead. Using a mixture of nitrogen, ammonia, and hydrogen gases as the source gas for remote plasma generation, and using suitable pressures and RF power, relative concentrations of amine radicals, nitrogen radicals, and hydrogen radicals can be controlled to obtain conformal silicon nitride film with uniform film properties within features of the semiconductor substrate.

Conclusion

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A remote plasma apparatus, comprising:

a reaction chamber comprising a processing space in which a semiconductor substrate is processed, wherein the reaction chamber is not configured to generate or sustain a direct plasma in the reaction chamber;

a remote plasma source fluidly coupled to and upstream of the reaction chamber;

an RF power supply configured to power plasma in the remote plasma source;

a showerhead fluidly coupled to the reaction chamber for delivery of plasma-activated species from the remote plasma source to the reaction chamber; and a substrate pedestal in the reaction chamber, wherein the substrate pedestal comprises an electrostatic chuck comprising a platen made of ceramic material and having an upper surface configured to support the semiconductor substrate, wherein the electrostatic chuck further comprises one or more electrostatic clamping electrodes, wherein the substrate pedestal comprises one or more heating elements configured to heat the semiconductor substrate to a temperature greater than about 450° C.

2. The remote plasma apparatus of claim 1, wherein the showerhead comprises an ion filter.

3. The remote plasma apparatus of claim 1, wherein the one or more heating elements are configured to heat the semiconductor substrate to a temperature between about 500° C. and about 700° C.

4. The remote plasma apparatus of claim 1, wherein the RF power supply is configured to supply RF power between about 2 kW and about 10 kW to the remote plasma source for generating plasma.

5. The remote plasma apparatus of claim 1, further comprising:

a first gas line fluidly coupled to the remote plasma source configured to supply a reactant gas to the remote plasma source; and a second gas line fluidly coupled to the reaction chamber configured to supply a silicon-containing precursor in a vapor phase to the semiconductor substrate without mixing with the reactant gas in the remote plasma source.

6. The remote plasma apparatus of claim 5, further comprising a controller configured with instructions to perform the following operations:

introduce a first dose of the silicon-containing precursor in the vapor phase to adsorb on the semiconductor substrate; and expose the semiconductor substrate to plasma-activated species of the reactant gas generated in the remote plasma source, wherein the plasma-activated species reacts with the silicon-containing precursor to form a silicon-containing film.

7. The remote plasma apparatus of claim 6, wherein the controller is further configured with instructions to perform the following operations:

set a chamber pressure in the reaction chamber to between about 1 Torr and about 30 Torr; and set a substrate temperature to an elevated temperature between about 500° C. and about 700° C.

8. The remote plasma apparatus of claim 6, wherein the controller is further configured with instructions to perform the following operations:

apply a first voltage to the electrostatic chuck of the substrate pedestal for clamping the semiconductor substrate in the reaction chamber;

reverse a polarity of the first voltage applied to the electrostatic chuck;

apply a second voltage to the electrostatic chuck that is less than the first voltage;

reverse a polarity of the second voltage applied to the electrostatic chuck; and remove the semiconductor substrate from the electrostatic chuck.

9. The remote plasma apparatus of claim 5, wherein the silicon-containing precursor comprises a silane.

10. The remote plasma apparatus of claim 1, wherein the ceramic material comprises an aluminum-containing material, and wherein the one or more electrostatic clamping electrodes are embedded in the platen.

11. The remote plasma apparatus of claim 1, further comprising:

an annular-shaped thermal shield under the substrate pedestal to reduce radiative heat loss from the substrate pedestal.

* * * * *